US011748531B2

(12) United States Patent
Chen et al.

(10) Patent No.: US 11,748,531 B2
(45) Date of Patent: Sep. 5, 2023

(54) MITIGATION OF HIGH FREQUENCY COUPLED VIBRATIONS IN PDC BITS USING IN-CONE DEPTH OF CUT CONTROLLERS

(71) Applicant: Halliburton Energy Services, Inc., Houston, TX (US)

(72) Inventors: Shilin Chen, Montgomery, TX (US); Christopher Charles Propes, Montgomery, TX (US); Curtis Clifford Lanning, Montgomery, TX (US); Bradley David Dunbar, The Woodlands, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 333 days.

(21) Appl. No.: 17/074,273

(22) Filed: Oct. 19, 2020

(65) Prior Publication Data
US 2022/0121790 A1 Apr. 21, 2022

(51) Int. Cl.
*G06F 30/20* (2020.01)
*E21B 10/43* (2006.01)
(Continued)

(52) U.S. Cl.
CPC .............. *G06F 30/20* (2020.01); *E21B 10/43* (2013.01); *E21B 47/00* (2013.01); *E21B 10/567* (2013.01)

(58) Field of Classification Search
CPC .......... G06F 30/20; E21B 10/43; E21B 47/00; E21B 10/567
See application file for complete search history.

(56) References Cited

U.S. PATENT DOCUMENTS 5,448,911 A 9/1995 Mason
5,721,376 A 2/1998 Pavone et al.
(Continued)

FOREIGN PATENT DOCUMENTS

WO 2014121448 8/2014

OTHER PUBLICATIONS

Jain JR, Oueslati H, Hohl A, Reckmann H, Ledgerwood LW, Tergeist M, Ostermeyer GP. High-Frequency Torsional Dynamics of Drilling Systems: An Analysis of the Bit-System Interaction. InIADC/SPE Drilling Conference and Exhibition Mar. 4, 2014. OnePetro. (Year: 2014).*

(Continued)

*Primary Examiner* — Chuen-Meei Gan
(74) *Attorney, Agent, or Firm* — DeLizio, Peacock, Lewin & Guerra

(57) ABSTRACT

Design parameters for PDC drill bit including in-cone depth of cut controllers (DOCCs) are correlated to instances of coupled vibrations in the axial, lateral, and torsional directions occurring during downhole drilling. Design parameters are quantified by drilling efficiency (DE), average in-cone DOCC contact area, average weight on bit (WOB) taken off by in-cone DOCC, and average torque on bit (TOB) taken off by in-cone DOCC. Design guidelines to mitigate coupled vibrations are generated by correlating design parameter quantifiers and instances of coupled vibrations. Potential drill bit designs are then validated against the generated guidelines in order to mitigate vibration in future drilling runs.

15 Claims, 16 Drawing Sheets

(51) Int. Cl.
   *E21B 47/00* (2012.01)
   *E21B 10/567* (2006.01)

(56) References Cited

U.S. PATENT DOCUMENTS

| | | | |
|---|---|---|---|
| 5,852,235 | A | 12/1998 | Pavone et al. |
| 6,021,377 | A | 2/2000 | Dubinsky et al. |
| 6,879,947 | B1 * | 4/2005 | Glass ............... E21B 45/00 |
| | | | 175/48 |
| 8,589,136 | B2 | 11/2013 | Ertas et al. |
| 8,863,860 | B2 | 10/2014 | Chen et al. |
| 9,581,008 | B2 | 2/2017 | Kyllingstad |
| 9,976,405 | B2 | 5/2018 | Hohl et al. |
| 10,400,547 | B2 | 9/2019 | Chen et al. |
| 10,878,145 | B2 | 12/2020 | Dykstra et al. |
| 2001/0020551 | A1 | 9/2001 | Taylor et al. |
| 2007/0192074 | A1 | 8/2007 | Chen |
| 2009/0166091 | A1 | 7/2009 | Matthews et al. |
| 2010/0032165 | A1 | 2/2010 | Bailey et al. |
| 2010/0224413 | A1 | 9/2010 | Warren |
| 2011/0077924 | A1 * | 3/2011 | Ertas ............... E21B 7/00 |
| | | | 703/2 |
| 2011/0214878 | A1 | 9/2011 | Bailey et al. |
| 2012/0111630 | A1 * | 5/2012 | Chen ............... E21B 10/55 |
| | | | 175/45 |
| 2012/0312603 | A1 | 12/2012 | Propes et al. |
| 2013/0081880 | A1 | 4/2013 | Schwefe et al. |
| 2017/0211357 | A1 | 7/2017 | Grosz et al. |
| 2018/0283161 | A1 * | 10/2018 | Bailey ............... E21B 45/00 |
| 2019/0106979 | A1 | 4/2019 | Hadi et al. |
| 2020/0386055 | A1 | 12/2020 | Chen |
| 2021/0047909 | A1 | 2/2021 | Bailey et al. |
| 2021/0081506 | A1 | 3/2021 | Detournay et al. |
| 2022/0121791 | A1 | 4/2022 | Chen et al. |

OTHER PUBLICATIONS

Chen, et al., "Identification and Mitigation of Friction- and Cutting Action-Induced Stick-Slip Vibrations with PDC Bits", Society of Petroleum Engineers, IADC/SPE International Drilling Conference and Exhibition, Mar. 3-5, 2020, Galveston, Texas, USA.

Teale, "The Concept of Specific Energy in Rock Drilling", International Journal of Rock Mechanics and Mining Sciences & Geomechanics Abstracts vol. 2, Issue 1, Mar. 1965, pp. 57-73.

"U.S. Appl. No. 16/433,937, Final Office Action", dated Jan. 13, 2023, 13 pages.

"U.S. Appl. No. 17/074,352, Final Rejection Action", dated Dec. 9, 2022, 21 pages.

Jain, et al., "Mitigation of Torsional Stick-Slip Vibrations in Oil Well Drilling through PDC Bit Design: Putting Theories to the Test", Presented at the SPE Annual Technical Conference and Exhibition, Denver, Colorado, USA, Oct. 30, 2011, 14 pages.

"U.S. Appl. No. 16/433,937, Non-Final Office Action", dated Aug. 5, 2022, 12 pages.

"U.S. Appl. No. 17/074,352, Non-Final Office Action", dated Aug. 2, 2022, 25 pages.

Bailey, et al., "Improved Methods to Understand and Mitigate Stick-Slip Torsional Vibrations", Presented at the IADC/SPE Drilling Conference and Exhibition, Fort Worth, Texas, USA, Mar. 6, 2018, 21 pages.

Chen, "Factors Affecting PDC Bit Directional Behaviors: Numerical Simulation and Applications", Proceedings of the International Field Exploration and Development Conference 2017, Chapter 11, Jul. 12, 2018, 19 pages.

Chen, et al., "Identification and Mitigation of Friction- and Cutting-Action-Induced Stick/Slip Vibrations with PDC Bits", Society of Petroleum Engineers Drilling & Completion, vol. 35, Issue 4, Dec. 17, 2020, 12 pages.

Chen, et al., "The Role of Rock-Chip Removals and Cutting-Area Shapes in Polycrystalline-Diamond-Compact-Bit Design Optimization", Society of Petroleum Engineers Drilling & Completion, vol. 30, Issue 4, Dec. 31, 2015, 14 pages.

Davis, et al., "Eliminating Stick-Slip by Managing Bit Depth of Cut and Minimizing Variable Torque in the Drillstring", Presented at the IADC/SPE Drilling Conference and Exhibition, San Diego, California, USA, Mar. 6, 2012, 9 pages.

Jaggi, et al., "Successful PDC/RSS Vibration Management Using Innovative Depth-of-Cut Control Technology: Panna Field, Offshore India", Presented at the SPE/IADC Drilling Conference, Amsterdam, The Netherlands, Feb. 20, 2007, 14 pages.

\* cited by examiner ness. From the correlation,

MITIGATION OF HIGH FREQUENCY COUPLED VIBRATIONS IN PDC BITS USING IN-CONE DEPTH OF CUT CONTROLLERS

TECHNICAL FIELD

The disclosure generally relates to earth drilling or mining and earth drilling, e.g. deep drilling, for obtaining oil, gas, water, soluble or meltable materials or a slurry of minerals from wells.

BACKGROUND

During drilling, drill bits and bottom hole assemblies experience axial, lateral, and torsional vibrations that can cause damage to both drilling apparatus and boreholes. Axial vibrations occur along the drillstring and result in inconsistent weight-on-bit. Lateral vibrations occur as the drill bit moves side to side. Torsional vibrations are inconsistencies in the rotational speed of the drill bit, such as stick-slip vibrations. Various modes of vibration cause differential shock loading and changes in tension throughout the drill string and can result in characteristic mechanical failure. In some instances, vibrations occurring along different axes become coupled producing complex rotational modes and harmonics: stick-slip vibration, bit bounce, backwards whirl, bit chatter, etc.

BRIEF DESCRIPTION OF THE DRAWINGS

Aspects of the disclosure may be better understood by referencing the accompanying drawings.

DESCRIPTION

The description that follows includes example systems, methods, techniques, and program flows that embody aspects of the disclosure. However, it is understood that this disclosure may be practiced without these specific details. For instance, this disclosure refers to depth of cut controllers (DOCCs) on PDC bits in illustrative examples. Aspects of this disclosure can be instead applied to DOCCs on other types of drill bit. In other instances, well-known instruction instances, protocols, structures, and techniques have not been shown in detail in order not to obfuscate the description.

Overview

Vibrations along more than one axis of vibration can become linked or coupled harmonically or resonantly, producing high-energy and high-frequency multi-axial vibrations—including both high frequency torsional oscillation (HFTO) and high-frequency three-dimensional coupled vibration (HF3D). These coupled high-frequency vibrations can occur at speeds up to several hundred Hertz (Hz) greater than the drill bit rotational speed and can cause damage to drill bits, drill strings, bottom hole assemblies, boreholes, etc., greater than the damage caused by other vibrational modes. Coupled vibrations are identified as a function of drill bit design, including as a function of drilling efficiency (DE) (for primary and backup cutters), and depth of cut controller (DOCC) design (where DOCC design parameters include area of contact, weight on bit applied to DOCCs, torque on bit applied to DOCCs, etc.), from drilling runs where accelerometers and gyroscopes are used to measure axial, lateral, and torsional acceleration and angular momentum, respectively. Various parameters of the drill bit contribute to drilling efficiency (DE), which can be used as a proxy to evaluate drill bit design—for polycrystalline diamond compact (PDC), depth of cut controller (DOCC) design is correlated to DE based on drill bit design and cutting simulations.

Using drill bit and DOCC design parameters from a set of drilling runs, including runs in which coupled vibrations are identified, coupled vibrations are correlated to drill bit design. Based on a relationship between DOCC design and drilling efficiency and the presence or absence of high-frequency vibrations, drill bit design criteria are chosen so that coupled, high-frequency vibrations are minimized in subsequent drill bits or drilling runs. From the correlation, drill bit design guidelines or rules are generated which minimize the chances that a specific drill bit will experience coupled vibrations. Based on these guidelines, drill bit designs are validated or adjusted to minimize coupled vibrations in subsequent drilling runs.

Example Illustrations

Figure 1:
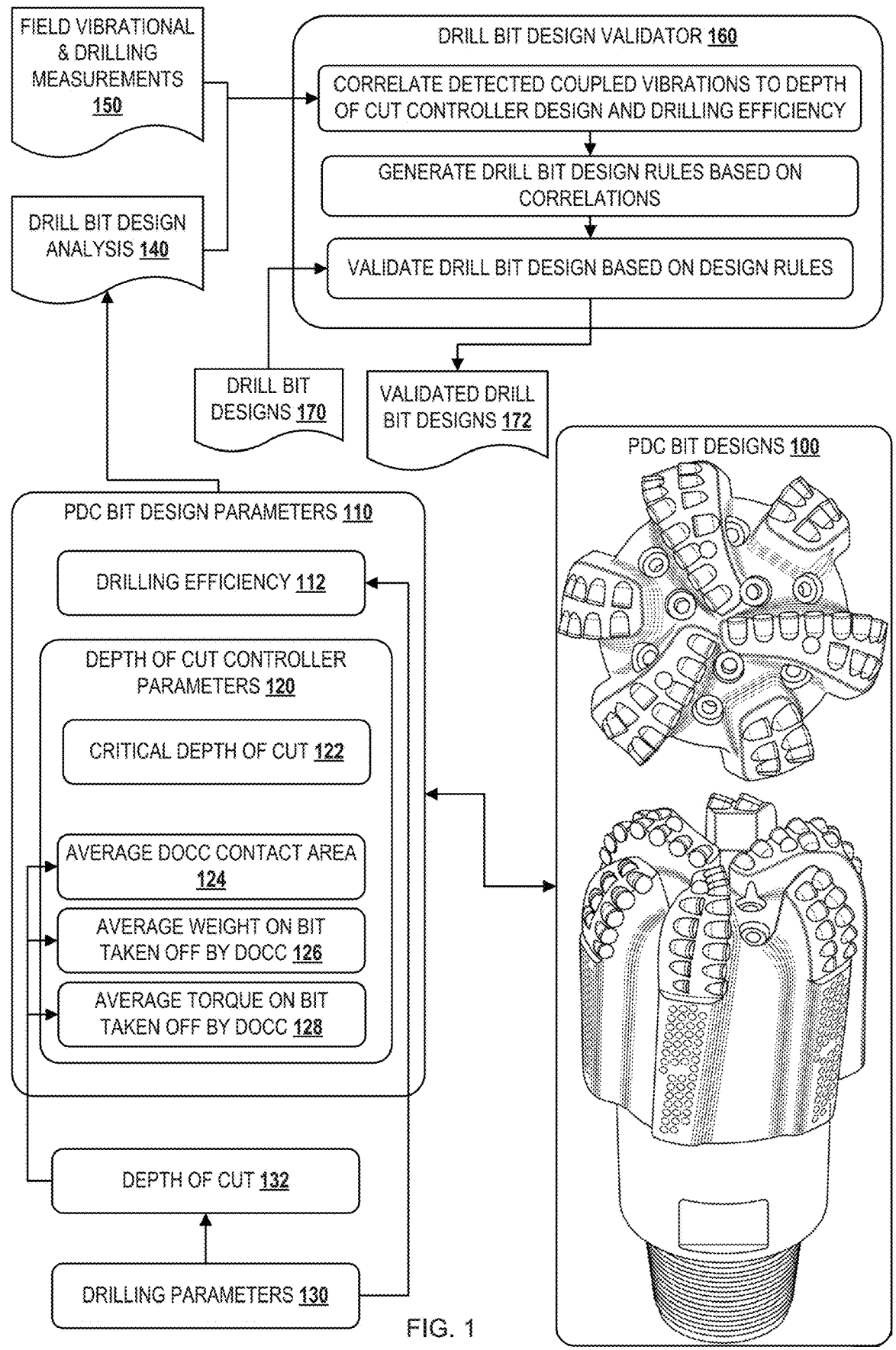
FIG. 1 illustrates an example system for correlating detected high frequency coupled vibrations and one or more drill bit design parameters in order to design drill bits with minimized or mitigated high frequency coupled vibrations.

FIG. 1 illustrates an example system for correlating detected high frequency coupled vibrations and one or more drill bit design parameters in order to design drill bits with minimized or mitigated high frequency coupled vibrations. The interaction between the drill bit and the rock can generate a bottom hole pattern which excited the bottom hole assembly (BHA) at a primary or harmonic frequency. The non-linearity of the BHA causes the primary vibration to spread across axes, creating coupled vibrations across one or more axis. Coupled vibrations may, therefore, be mitigated by bit design where design parameters can mitigate the strength of the drill bit and rock interactions at the primary frequency.

DOCCs control how close the cutting sections of a drill bit (including PDC type bits) approach the bottom of the borehole, sidewall of the borehole or other formation face and can be used to reduce impact of the drill bit with the borehole bottom, reduce the strength of drill bit and rock interactions, or create a standoff distance between drill bit and rock faces. DOCCs can be located on one or more surfaces or faces of the drill bit, including on a roller, inside the cone of a PDC bit, outside the cone of a PDC bit (including on the nose, taper, shoulder, or gauge), etc. DOCCs include impact arrestors, carbide impact arrestors (CIA), rolling or roller elements, axial arrestors, modified diamond reinforced (MDR) cutters and other secondary cutters, etc.

As shown in FIG. 1, PDC bit designs 100 include the design of the cutting surfaces of the drill bit, and can include various control, hydraulic, and stabilization elements. PDC bit designs 100 are categorized by PDC bit design parameters 110, which include depth of cut controller parameters 120. The PDC bit design parameters 110 include bit dimensions, shape of bit profile, number of blades, number of cutters, type of cutters, back rake angle, side rake angle, primary cutter layout, backup cutter layout, number and location DOCCs and DOCC design, gauge pad aggressiveness, etc. which will be discussed in greater detail in reference to FIG. 2. The PDC bit design parameters 110 influence a drilling efficiency (DE) 112. The drilling efficiency (DE) 112 is given by Equation 1, below:

$$DE = \frac{\sigma_{rock}}{E_s} * 100\% \qquad (1)$$

where $\sigma_{rock}$ is the rock compressive strength and $E_s$ is the mechanical specific energy as given in Equation 2, below. $E_s$ is given in pounds per square inch (psi) as:

$$E_s = \frac{WOB}{A} + \frac{120\,\pi*RPM*TOB}{A*ROP} \qquad (2)$$

where A (in square inches or in$^2$) is the cross-sectional area of hole drilled by the drill bit, WOB is the weight on bit, TOB is torque on bit, ROP is rate of penetration, and RPM is revolutions per minute (rev/min) of the drill bit. DE as calculated using Eqns. 1 and 2 depends on both formation information, i.e. rock compressive strength, and on drilling parameters, i.e. WOB, TOB, ROP, and RPM. The drilling efficiency (DE) 112 depends on drilling parameters 130, where the drilling parameters 130 include WOB, TOB, ROP, and RPM.

The drilling efficiency (DE) 112 of a PDC bit can also be calculated theoretically from the PDC bit design parameters 110, where formation and drilling parameters are assumed or averaged, and can be therefore used as a proxy for the total design and its efficiency. The drilling efficiency (DE) 112 can also be calculated for different formation and drilling parameters and averaged to provide an average DE, as will be discussed in reference to FIG. 5. Guidelines for drill bit design are generated by correlating the drilling efficiency (DE) 112 or others of the PDC bit design parameters 110 to occurrences of coupled vibrations.

The depth of cut controller parameters 120 include critical depth of cut (CDOC) 122, average DOCC contact area 124, average WOB taken off by DOCC 126, and average TOB taken off by DOCC 128 for each DOCC. Depth of cut (DOC) 132 is the amount per revolution (in inches per revolution (in/rev) or another unit) that a drill bit removes. The DOC 132 depends on the drilling parameters 130, but can also depend on both formation and drilling parameters, can be calculated theoretically (for an ideal or average formation or drilling parameters), or measured from data produced during a real world drilling run. The CDOC 122 is the depth of cut (DOC) at which the DOCC starts to contact the formation—for DOCs greater than the CDOC 122, the DOCC is in contact with the bottom of the borehole and for DOCs smaller than the CDOC 122, the DOCC does not contact the formation. The CDOC 122 is a function of the drill bit design and independent of formation and drilling parameters and can measure the offset between the depth at which cutters contact the formation versus the depth at which DOCCs contact the formation.

The average DOCC contact area 124 is an average of the DOCC contact area over a range of DOCs. The DOCC contact area, measured in square inches (in$^2$) is the area of contact between the DOCCs located in the cone of the PDC bit and the formation at a specific DOC. The DOCC contact area is zero for DOCs smaller than the CDOC 122, i.e. where any cone DOCCs are not in contact with the formation. At the CDOC 122 the cone DOCCs meet the formation. When the DOC 132 increases past the CDOC 122, the cone DOCCs contact area with the formation increases as the DOCCs are pushed into the formation face—which thereby increases the force with which the DOCCs push off of the formation which is the method by which DOCCs control depth of cut. The average DOCC contact area 124 is calculated by averaging the cone DOCC contact area over a DOC range that represents normal or expected drilling conditions, as will be discussed in reference to FIG. 6. The DOC range runs from 0 in/rev or otherwise below the CDOC 122 to a maximum DOC dependent on the number of blades in the drill bit and calculated from drilling data, as will be discussed in reference to FIGS. 4A-4B.

The average WOB taken off by DOCC 126 is an average of the WOB applied to the formation by the DOCCs as a percentage of the WOB applied to the drill bit over a range of DOCs. The WOB applied to the BHA or drill bit is applied to the formation by the drill bit at points of contact between the drill bit and the formation face. When the DOC 132 is smaller than the CDOC 122, the WOB taken off by the cone DOCCs is negligible because the cone DOCCs do not contact the formation. As the DOC 132 increases, more WOB is applied by the DOCCs as they come into greater contact with the formation. The average weight taken off by the DOCCs is given by Equation 3, below:

$$\overline{WOB} = \frac{WOB_{DOCC}}{WOB} * 100\% \qquad (3)$$

where $\overline{WOB}$ is the average WOB taken off by the DOCC 126 as a dimensionless percentage, $WOB_{DOCC}$ is the average WOB applied by the DOCC (in thousands of pounds of equivalent units), and WOB is the average WOB applied by the bit (in thousands of pounds or equivalent units). The averaged WOBs are calculated over the realistic DOC range for the PDC bit configuration. The relationship between WOB taken off by the DOCC 126 and DOC will be discussed in reference to FIG. 7.

The average TOB taken off by DOCC 128 is an average of the TOB applied to the formation by the DOCC as a percentage of the TOB applied to the drill bit over a range of DOCs. The TOB is applied to the formation at the points of contact between the drill bit and the formation faces, including sidewalls, and can include torque lost to drag, drilling mud, or other torsional effects. When the DOC 132 is smaller than the CDOC 122, the TOB taken off by the cone DOCCs is negligible because the cone DOCCs do not contact the formation. As the DOC 132 increases, more torque is applied by the DOCCs as they come into greater contact with the formation. The average TOB taken off by DOCC 128 is given by Equation 4, below:

$$\overline{TOB} = \frac{TOB_{DOCC}}{TOB} * 100\% \quad (4)$$

where $\overline{TOB}$ is the average TOB taken off by the DOCC 128 as a dimensionless percentage, $TOB_{DOCC}$ is the average TOB applied by the DOCC (in pound feet or equivalent units), and TOB is the average TOB applied by the bit (in pound feet or equivalent units). The averaged TOBs are calculated over the realistic DOC range for the PDC bit configuration. The relationship between TOB taken off by the DOCC 128 and DOC will be discussed in reference to FIG. 8.

The PDC bit design parameters 110, including the DOCC parameters 120, characterize the drill bit design and allow correlation between drill bit characteristics and drilling behavior. A drill bit design analysis 140 encompasses selected, known, or determined design parameters, including the PDC bit design parameters 110. To identify drill bit design characteristics that correlate to or mitigate coupled vibrations, the drill bit design analysis 140 is correlated to field vibrational and drilling measurements 150. The field vibrational and drilling measurements 150 include vibrational data generated by PDC drill bits with on-board vibrational measurement systems. Accelerometers and gyroscopes, in each of the three axes, are included in the drill bit design at the electrical connection where the drill bit joins a bottom hole assembly. Axial, lateral, and torsional vibrations are calculated from measured axial, lateral, and torsional displacement, where torsional vibrations represent irregularities in bit rotation or rotations per minute (RPM), as will be discussed further in reference to FIG. 3.

A drill bit design validator 160 correlates the drill bit design analysis 140 and the field vibrational and drilling measurements 150 in order to generate drill bit design guidelines to minimize coupled vibrations. The drill bit design validator 160 can operate on a set or batch of drill bit designs together with their corresponding field data, or can iteratively update or refine guidelines based on additional drill bit design and field vibrational data. Optionally, the drill bit validator 160 may update guidelines based on real time measurements of field vibrational and drilling measurements 150 and allow for adjustment of drilling parameters 130 to mitigate detected coupled vibrations. The drill bit design validator 160 correlates field vibrational and drilling measurements 150 to the drill bit design analysis 140 for the drill bit used during the field measurement. The drill bit design validator 160 analyzes the field vibrational and drilling measurements 150 to detect instances of coupled vibrations. PDC bit design parameters 110 are mapped to instances of coupled vibration and instances where no coupled vibrations are detected. The drill bit design validator 160 can map detected coupled vibrations to one or more PDC bit design parameter 110 and generate a multi-dimensional map of the drill bit design space where coupled vibrations are not detected or are not frequently detected. The drill bit design validator 160 generates design rules or guidelines based on the mapped correlations between PDC bit design parameters 110 and detected coupled vibrations. The design rules or guidelines can be permissive or restrictive. Permissive design guidelines indicate various combinations of drill bit design parameters that encompass the drill bit design space where coupled vibrations are not detected or are not frequently detected. Restrictive design guidelines/rules indicate various combinations of drill bit design parameters that do not encompass the drill bit design space where coupled vibrations are not detected or are not frequently detected. Rules or guidelines may be based on one design parameter (e.g., CDOC 122), one design parameter that encompasses multiple design parameters or is a proxy for the total design (e.g., drilling efficiency (DE) 112), or based on a relationship between two or more design parameters (e.g., number of blades and CDOC 122).

The drill bit design validator 160 validates drill bit designs based on the generated guidelines. Drill bit designs 170 include data for one or more drill bit. The drill bit designs 170 can encompass all parameters of the drill bit design including the PDC bit design parameters 110 or can include a subset of the PDC bit design parameters 110. The drill bit design validator 160 compares the drill bit designs 170 to the generated guidelines. The drill bit design validator 160 selects or outputs a subset of the drill bit designs 170 as validated drill bit designs 172. The validated drill bit designs 172 are those of the drill bit designs 170 that satisfy or conform to the generated design rules or guidelines for mitigated coupled vibration. Optionally, the drill bit design validator 160 can adjust one or more of the PDC bit design parameters 110 of one or more of the drill bit designs 170 so that the one or more drill bit designs comply with the design rules. The validated drill bit designs 172 can contain additional drill bit designs that are adjusted versions of one or more of the drill bit designs 170.

Figure 2:
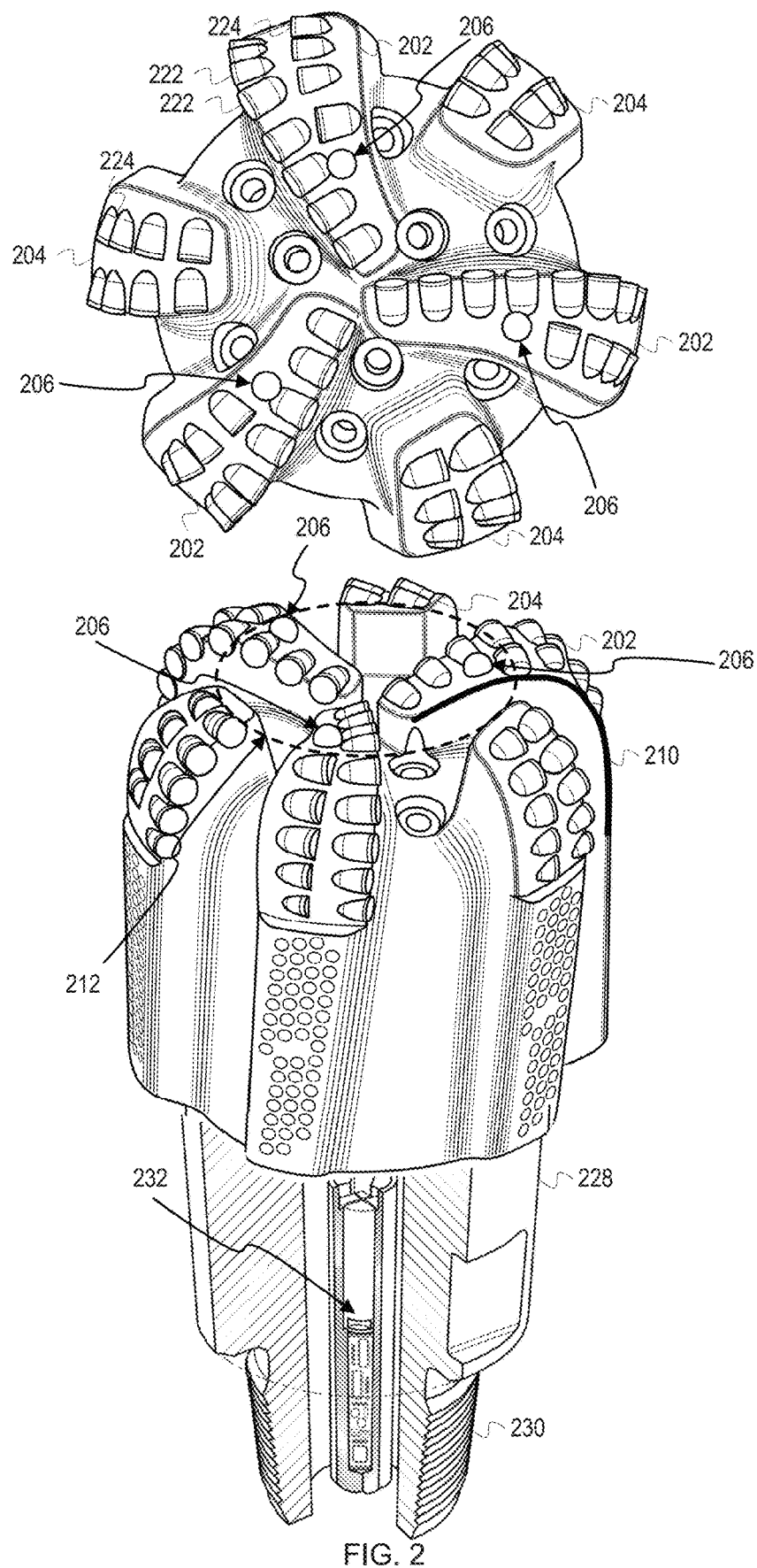
FIG. 2 depicts an example polycrystalline diamond compact (PDC) drill bit with depth of cut controllers (DOCCs) in the cone.

FIG. 2 depicts an example polycrystalline diamond compact (PDC) drill bit with depth of cut controllers (DOCCs) in the cone. The example PDC drill bit design includes primary blades 202, backup blades 204, cone DOCCs 206, primary cutters 222, backup cutters 224, shank 228, and a pin connection 230. The cone DOCCs 206 are shown within a cone 212 where the cone corresponds to the central portion of a bit profile 210 where the drill bit profile 210 curves inward towards the center of the drill bit. In the example bit, three of the cone DOCCs 206 are shown—one protrudes from each of the primary blades 202. The PDC bit can have one or more cone DOCCs 206 per blade, cone DOCCs on both the primary blades 202 and the secondary blades 204, and additional DOCCs located outside the cone (not shown). The cone DOCCs 206 can be impact arrestors, roller cutters, modified diamond reinforcement (MDR) cutters, etc. The pin connection 230 can be a connector according to any of the specifications of the American Petroleum Institute (API), including an API Specification 7 pin connection, or another equivalent connection type.

An embedded vibrational measurement device 232 comprises circuitry placed within the PDC drill bit, including inside any combination of the shank 228 and pin connection 230, measures drill bit vibration. Drill bit vibration can be measured as a function of location (or displacement), velocity, or acceleration (including radial velocity and radial acceleration) by accelerometers and gyroscopes within the vibrational measurement device 232. Drill bit vibration occurs along axial, lateral, and torsional axes. Vibrational measurements are stored in memory at the PDC bit, where the memory can be located at any point in the bit or bottom hole assembly or in the vibrational measurement device 232. Vibrational measurements are retrieved from the vibrational measurement device 232 and logged when the bottom hole assembly is returned to the surface. Optionally, vibrational measurements may be transmitted to another portion of the bottom hole assembly for storage or transmitted a computer at the surface or a drilling controller for real-time analysis of vibrational data. Characteristics of the cone DOCCs 206 correspond to instances or likelihood of coupled vibrations and DOCC design are chosen to mitigate vibrations, based on the correlation of known DOCC design characteristics and detected coupled vibrations.

Figure 3:
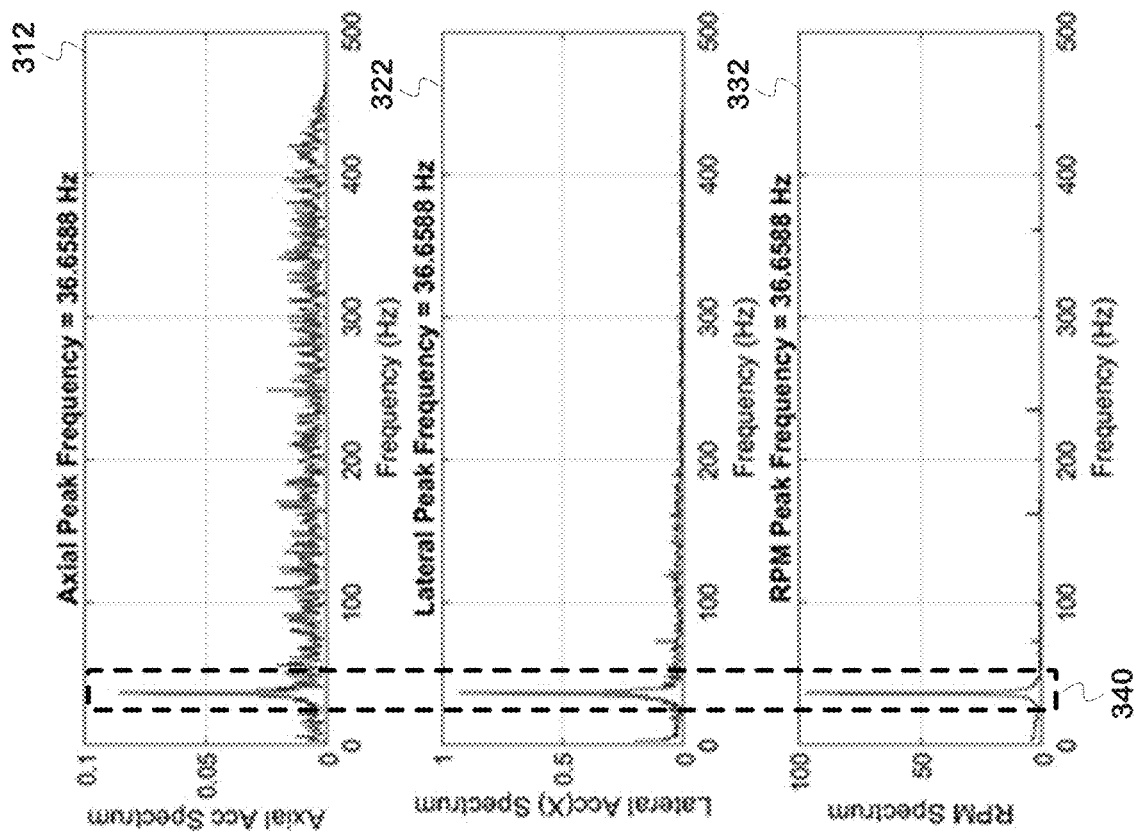
FIG. 3 depicts an example identified three-dimensional coupled vibrations measured during drilling.
Figure 3:
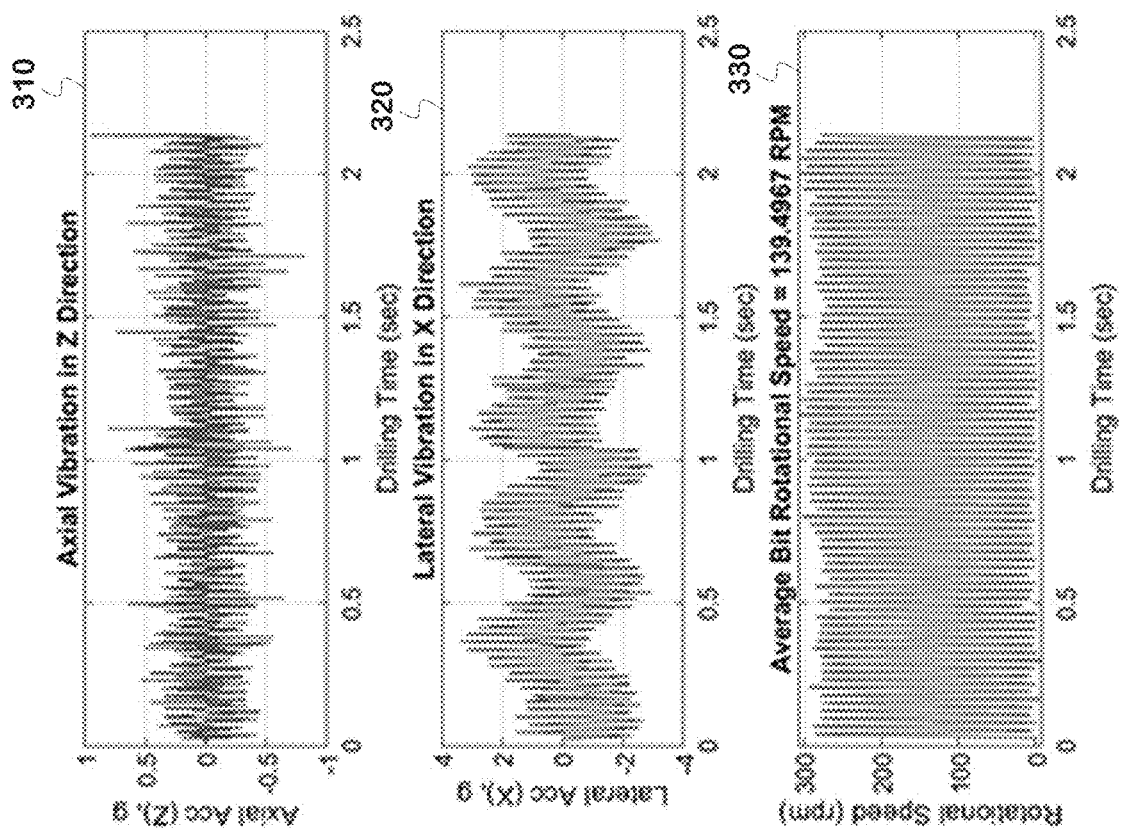

FIG. 3 depicts an example identified three-dimensional coupled vibrations measured during drilling. Graph 310 depicts axial acceleration as a function of time. Graph 320 depicts lateral acceleration as a function of time. Graph 330 depicts rotational speed as a function of time. The graph 320 displays both a high frequency signal (with a frequency of approximately 40 Hertz (Hz)) and a low frequency signal (occurring at approximately 2 Hz). The graphs 310 and 330 also display high frequency signals. To determine if coupled vibrations are present, the vibrational signals separated into their frequency components, using a fast Fourier transform (FFT) or similar method. The graph 310 of axial acceleration corresponds to graph 312 of the axial acceleration spectrum. The graph 320 of the lateral acceleration corresponds to graph 322 of the lateral acceleration spectrum. The graph 330 of the rotational speed corresponds to graph 332 of the PRM spectrum. Coupled vibrations are identified by frequency, where coupled vibrations occur in two or more axes at the same or substantially the same frequency. High frequency coupled vibrations are those coupled vibrations occurring at a frequency greater than the bit rotational speed, where a high frequency arises due to excitation of a vibrational mode of the bottom hole assembly. Vibrational frequency peaks or maximums that occur across one or more axes of vibration and do not correspond to the bit rotational speed are identified as corresponding to coupled vibrational modes, as shown for the peaks located in box 340 across the graphs 312, 322, and 332. High frequency coupled vibrations include high frequency torsional vibrations, where a torsional-lateral or torsional-axial vibration is excited, and three-dimensional high-frequency vibrations, where a torsional-axial-lateral vibrational mode is excited. Three-dimensional high-frequency vibrations include high frequency torsional oscillations, but not all high-frequency torsional vibrations correspond to coupled vibrations (i.e. the torsional mode can be excited alone under certain circumstances).

Three-dimensional coupled vibrations are detected when three conditions are met. (1) A peak (or local maximum) occurs at a frequency greater than a minimum frequency, such as 5 Hz, substantially simultaneously for axial, lateral, and torsional vibration. (2) Significant variation in bit RPM is detected, i.e. such that a statistically significant incident of bit RPM variation satisfies Equation 5, below:

$$SSI = \frac{\text{Max}(RPM) - \text{Mean}(RPM)}{\text{Mean}(RPM)} > 1 \qquad (5)$$

where Max(RPM) is the maximum RPM, Mean(RPM) is the mean RPM, and SSI is an interval or incidence of statistically significant variation in bit RPM. (3) The bit rotation at the dominant frequency is greater than a minimum RPM, such as 40 RPM or another floor that separated high frequency vibrations from low frequency vibrations. High frequency three-dimensional coupled vibrations satisfy all three conditions, while high frequency coupled vibrations can satisfy conditions 2 and 3 while occurring in only two axes. High frequency torsional vibrations satisfy conditions 2 and 3. Minimum frequencies, thresholds, and statistical significance determinations can vary, and 5 Hz and 40 RPM are for example purposes.

To determine design guidelines for mitigating coupled vibrations, vibrational data from a drilling run is examined for the presence of coupled vibrations. For instance, the graphs 310, 320, and 330 correspond to the same approximately two seconds (sec) interval for a drill bit, during a drilling run. Drilling run vibrational data can be sampled, such that intervals are selected from a total drilling run, vibrational data can be batched, such that vibrational data is divided into portions and frequency analyzed, or a substantial portion of a drilling run can be transformed and analyzed to detect high frequency vibrations. To detect coupled vibrations, drilling run vibrational data can be analyzed along a single axis first and then compared to vibrational data for one or more other axes. In instances where high frequency coupled vibrations are detected, drill bit design parameters, such as DE, DOC, etc. can be calculated or recalculated based on drilling parameters for the drilling run. Alternatively, average values for the drill bit design can be used.

Figure 4A:
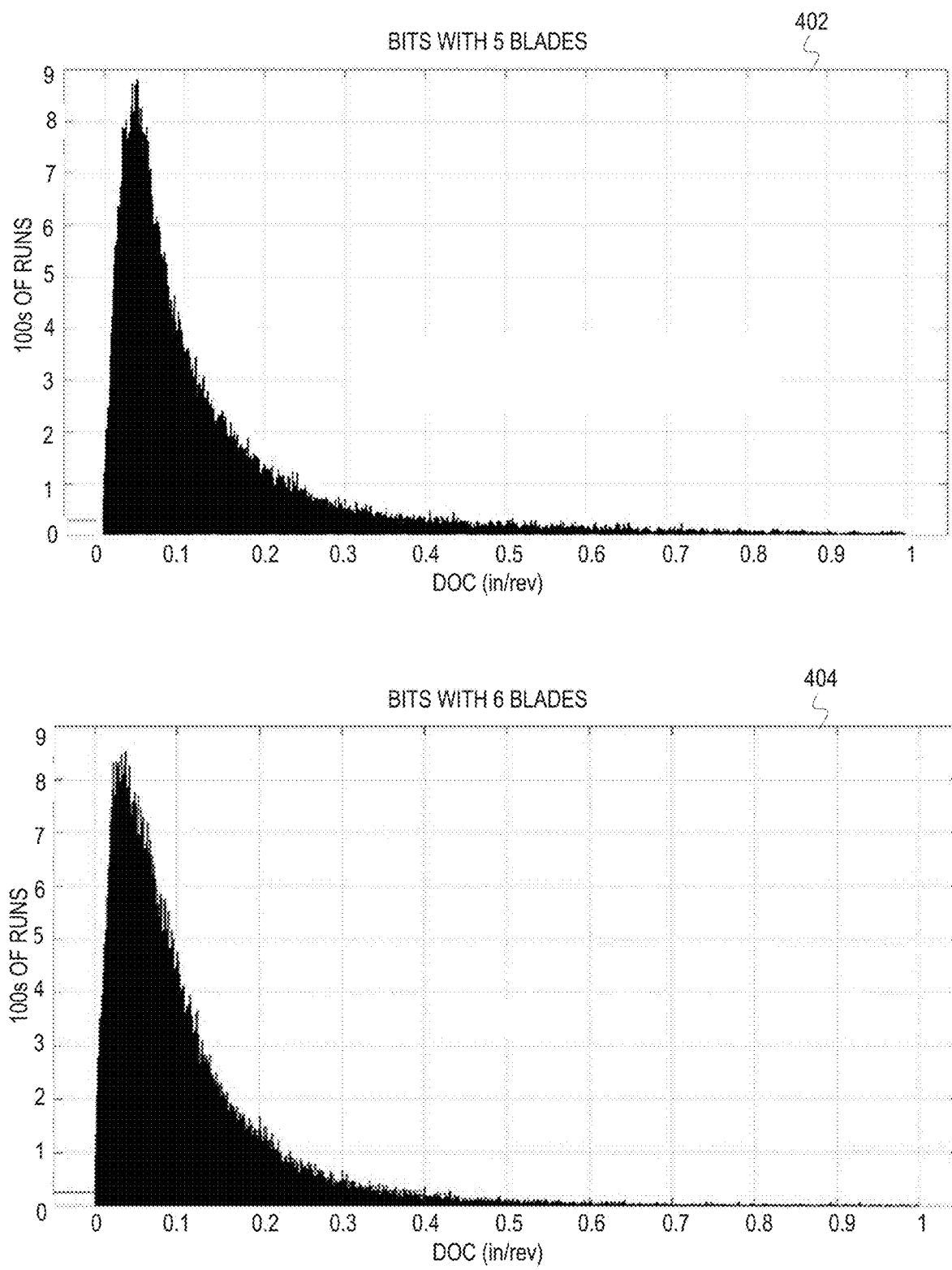
FIG. 4A depicts histograms of depth of cut (DOC) for example drilling runs for PDC bits with 5 blades and 6 blades.

FIG. 4A depicts histograms of depth of cut (DOC) for example drilling runs for PDC bits with 5 blades and 6 blades. Graph 402 depicts DOC in in/rev for PDC bits with five blades as a function of number of runs falling within each DOC interval. 88776 total drilling runs are included, with a mean DOC of 0.13715 in/rev and a median DOC of 0.080473 in/rev. To obtain average DOCC contact area, average WOB taken off by DOCC, and average TOB taken off by DOCC for a cone DOCC, those values are averaged over realistic DOC values. A DOC range is determined based on data from previous drilling runs with similar bits. The DOC range is determined by PDC bit blade number but can optionally be determined based on another bit design parameter. As shown in the graph 402, measured DOCs fall within a peak such that a range can be known or selected. In this example, the distribution of DOCs is similar to a chi-squared ($\chi^2$) distribution. Based on the graph 402, for five bladed PDC bits the DOC range lies between 0 in/rev and 0.5 in/rev.

A graph 404 depicts DOC in in/rev for PDC bits with six blades as a function of number of runs within each DOC interval. 133929 runs are plotted, with a mean DOC of 0.11127 in/rev, a median DOC of 0.077108 in/rev, and a DOC range between 0 and 0.4 in/rev.

Figure 4B:
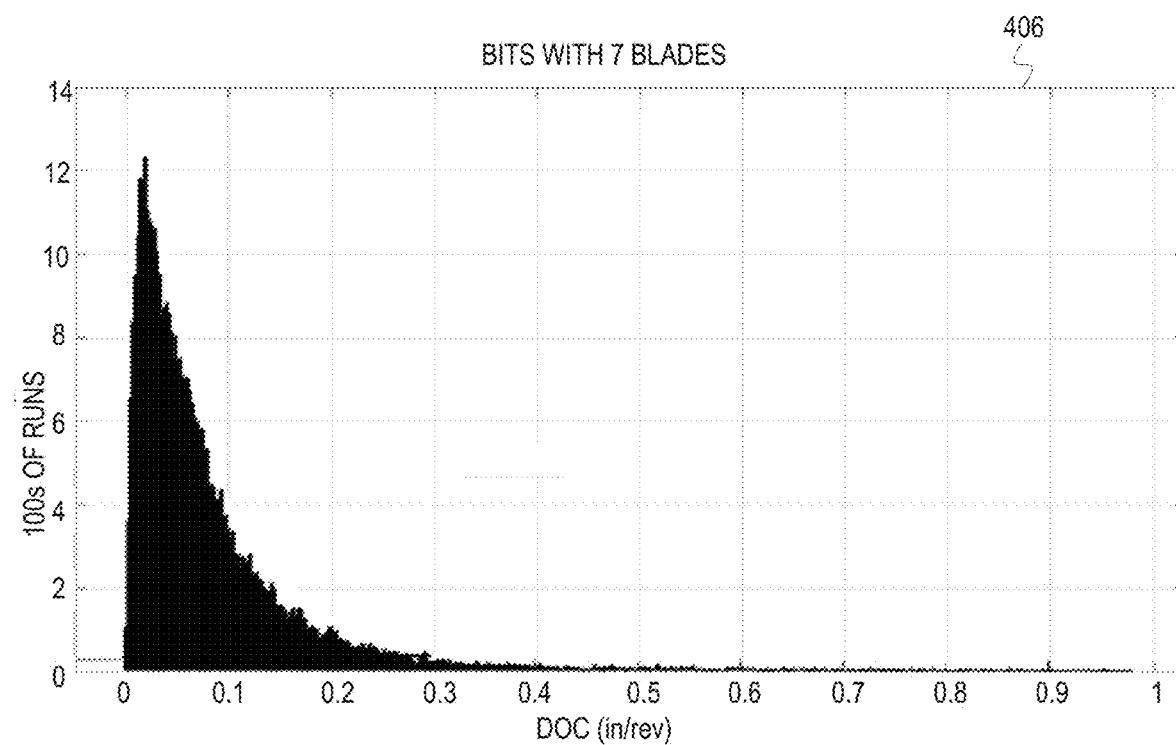
FIG. 4B depicts histograms of DOC for example drilling runs for PDC bits with 7 blades and 8 blades.
Figure 4B:
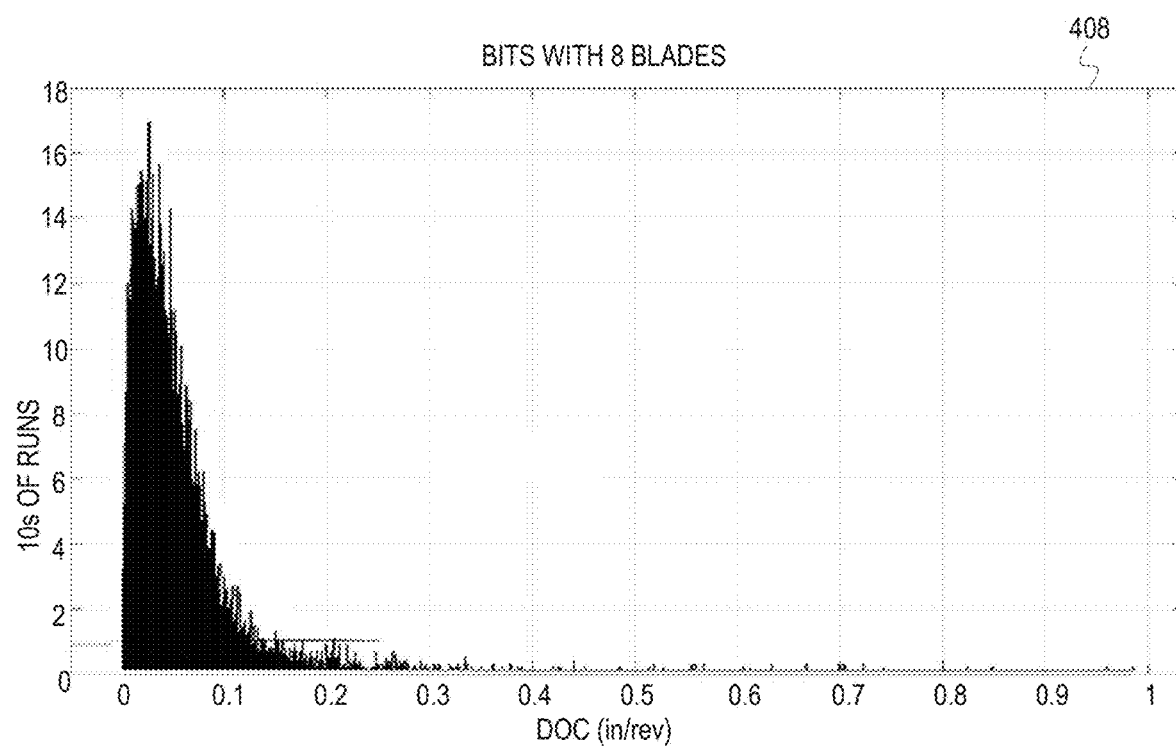

FIG. 4B depicts histograms of DOC for example drilling runs for PDC bits with 7 blades and 8 blades. A graph 406 depicts DOC in in/rev for PDC bits with seven blades as a function of number of runs for each DOC interval. 42109 runs are graphed, with a mean DOC of 0.083898 in/rev, a median DOC of 0.05612 in/rev, and a DOC range between 0 and 0.3 in/rev. A graph 408 depicts DOC in in/rev for PDC bits with eight blades as a function of number of runs within each DOC interval. 10654 runs are plotted, with a mean DOC of 0.053062 in/rev, a median DOC of 0.039761 in/rev, and a DOC range between 0 and 0.25 in/rev.

Figure 5:
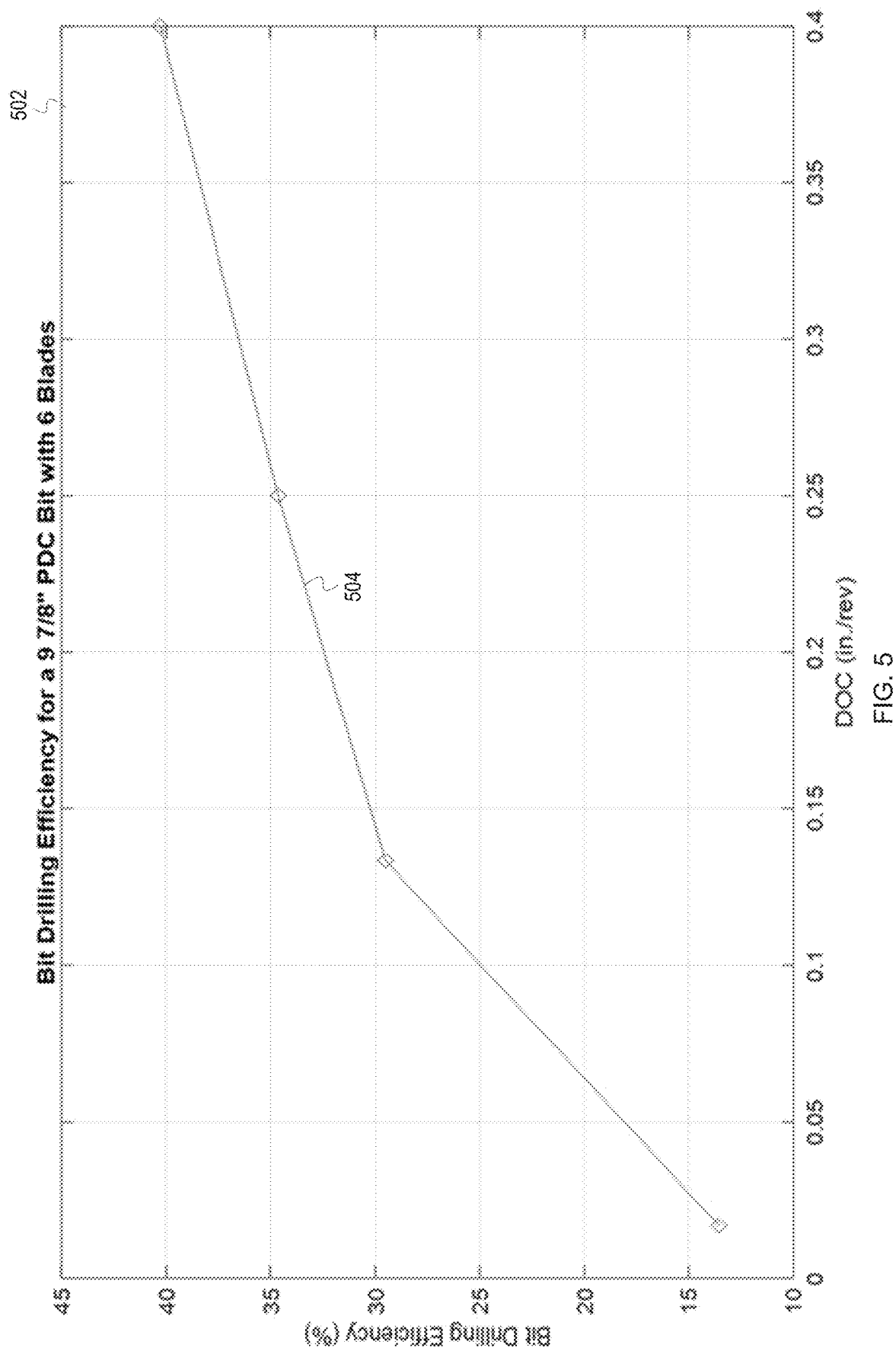
FIG. 5 illustrates an example relationship between drilling efficiency (DE) and DOC for an example PDC bit.

FIG. 5 illustrates an example relationship between drilling efficiency (DE) and DOC for an example PDC bit. Graph 502 depicts DE as a function of DOC for a 9⅞" PDC bit with six blades. Curve 504 represents a trend for bit DE as a DOC increases over a DOC range between 0 and 0.4 in/rev (which is the six blade PDC DOC range as shown in FIG. 4A). By averaging the values of bit DE over the DOC range, an average DE of 29.49% is calculated. Bit DE increases as DOC increases, but other factors can make large DOCs economically unfavorable such as bit wear, torque requirements, BHA wear, cutting removal rate, etc.

Figure 6:
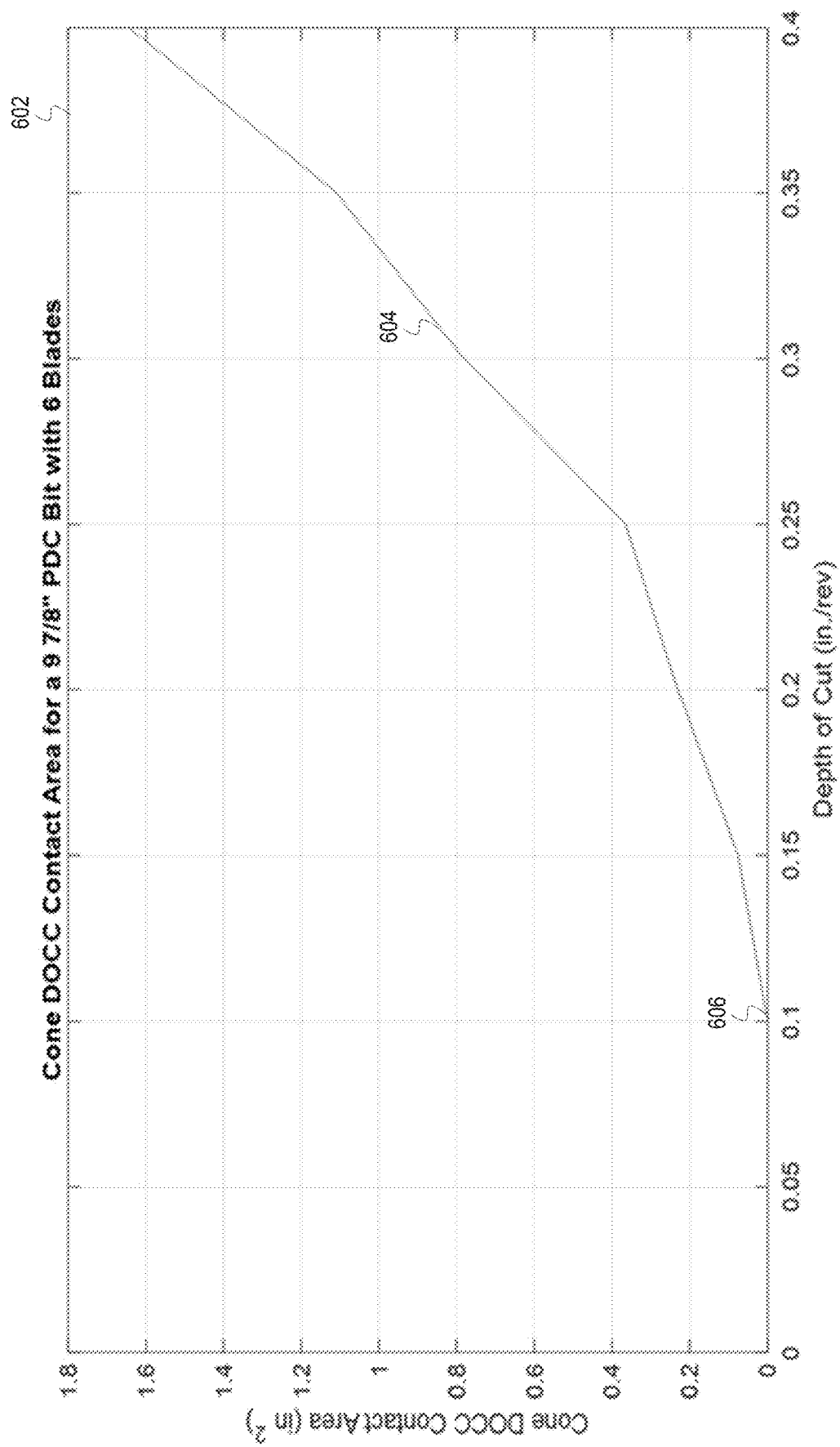
FIG. 6 illustrates an example relationship between cone DOCC contact area and DOC for an example PDC bit.

FIG. 6 illustrates an example relationship between cone DOCC contact area and DOC for an example PDC bit. Graph 602 depicts a contact area in $in^2$ for a DOCC located in the cone of a 9⅞" PDC bit with six blades in contact with the formation as a function of DOC. For DOC smaller than a CDOC 606, the contact area between the cone DOCC and the formation are negligible. For DOCs larger than the CDOC 606, contact area increases with DOC as shown by curve 604. The CDOC 606 is approximately 0.1 in/rev. By averaging sizes of the contact area over the appropriate DOC range (0 to 0.4 in/rev for a 6 blade PDC in this example) an average contact area of 0.3505 $in^2$ is calculated.

Figure 7:
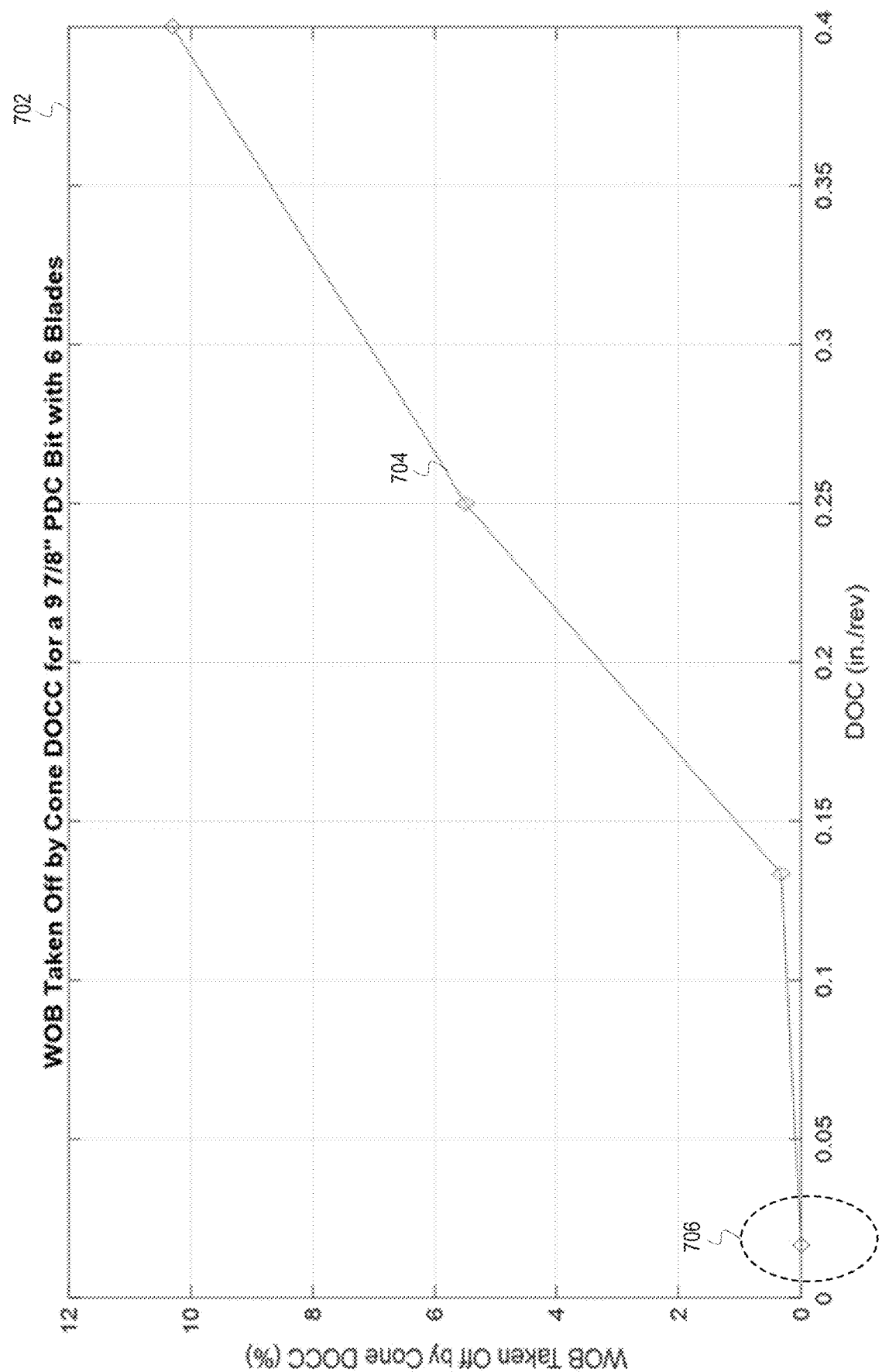
FIG. 7 illustrates an example relationship between weight on bit (WOB) taken off by a cone DOCC and DOC for an example PDC bit.

FIG. 7 illustrates an example relationship between weight on bit (WOB) taken off by a cone DOCC and DOC for an example PDC bit. Graph 702 depicts a percentage of WOB taken off by an in-cone DOCC for a 9⅞" PDC bit with six blades as a function of DOC in in/rev. WOB taken off by a cone DOCC increases with DOC as shown by curve 704—WOB taken off by a cone DOCC increases as the DOCC comes into greater contact with the formation, where contact area also increases as a function of DOC (as shown in FIG. 6). For DOCs smaller than a CDOC, the WOB taken off by a cone DOCC is negligible, as shown for point 706 where a DOC of approximately 0.2 in/rev corresponds to 0% WOB taken off by a cone DOCC and where the DOCC is not in contact with the formation. In this regime below the CDOC, the DOCC is not controlling DOC. Over the DOC range between 0 and 0.4 in/rev for the six bladed PDC, the average WOB is calculated as 4.03%

Figure 8:
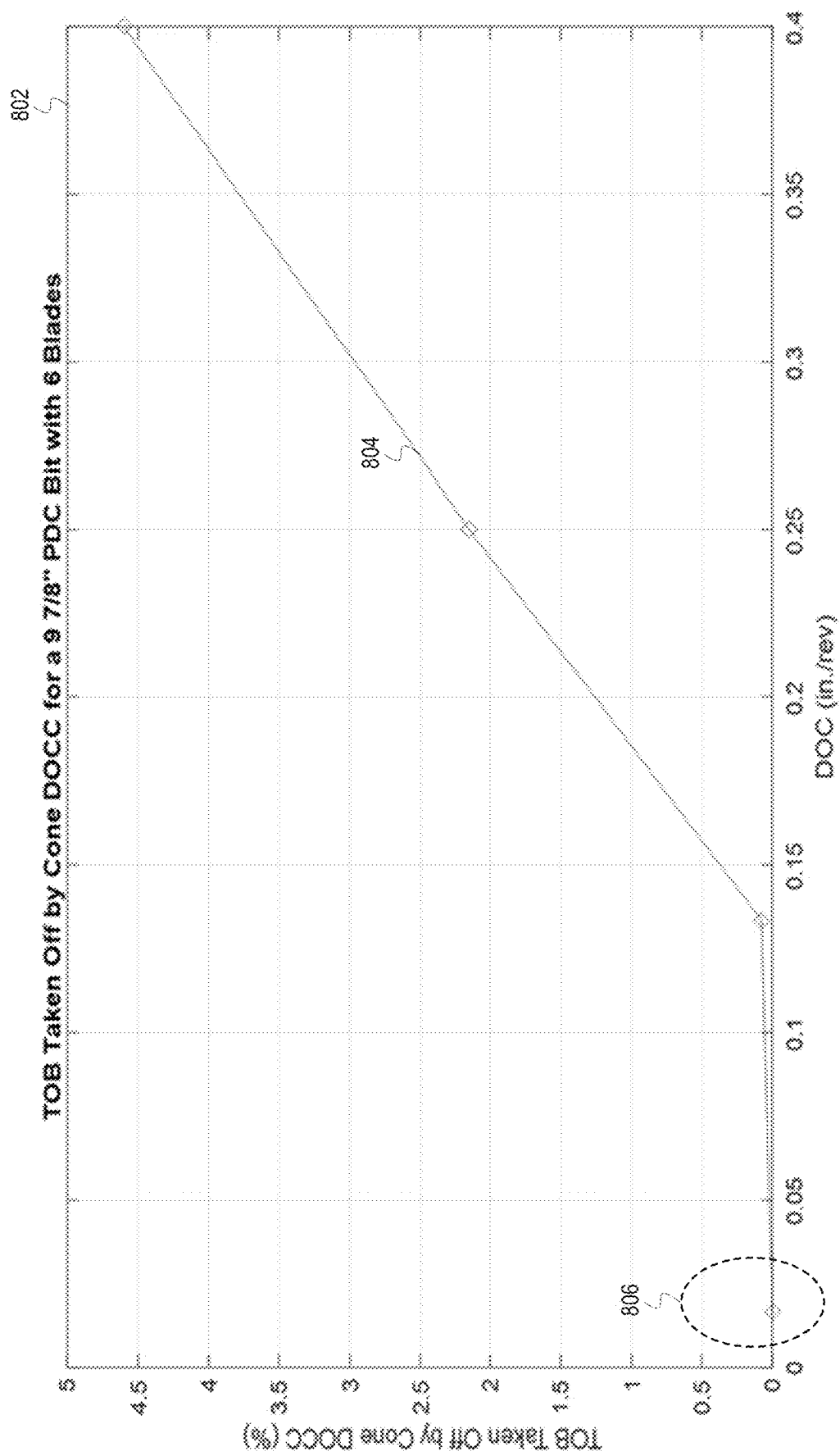
FIG. 8 illustrates an example relationship between torque on bit (TOB) taken off by a cone DOCC and DOC for an example PDC bit.

FIG. 8 illustrates an example relationship between torque on bit (TOB) taken off by a cone DOCC and DOC for an example PDC bit. Graph 802 depicts a percentage of TOB taken off by an in-cone DOCC for a 9⅞" PDC bit with six blades as a function of DOC. TOB take off by a cone DOCC increases with DOC, when the DOC is larger than a CDOC as shown by curve 804. For DOC smaller than the CDOC, the TOB taken off by an in-cone DOCC is negligible, as shown for point 806 where a DOC of ~0.2 in/rev corresponds to 0% of TOB taken off by the cone DOCC. By averaging TOB taken off by the cone DOCC over the DOC range of 0-0.4 in/rev (for a six blade PDC bit as shown in FIG. 4A), an average TOB taken off by the cone DOCC of 1.71% is calculated.

Figure 9:
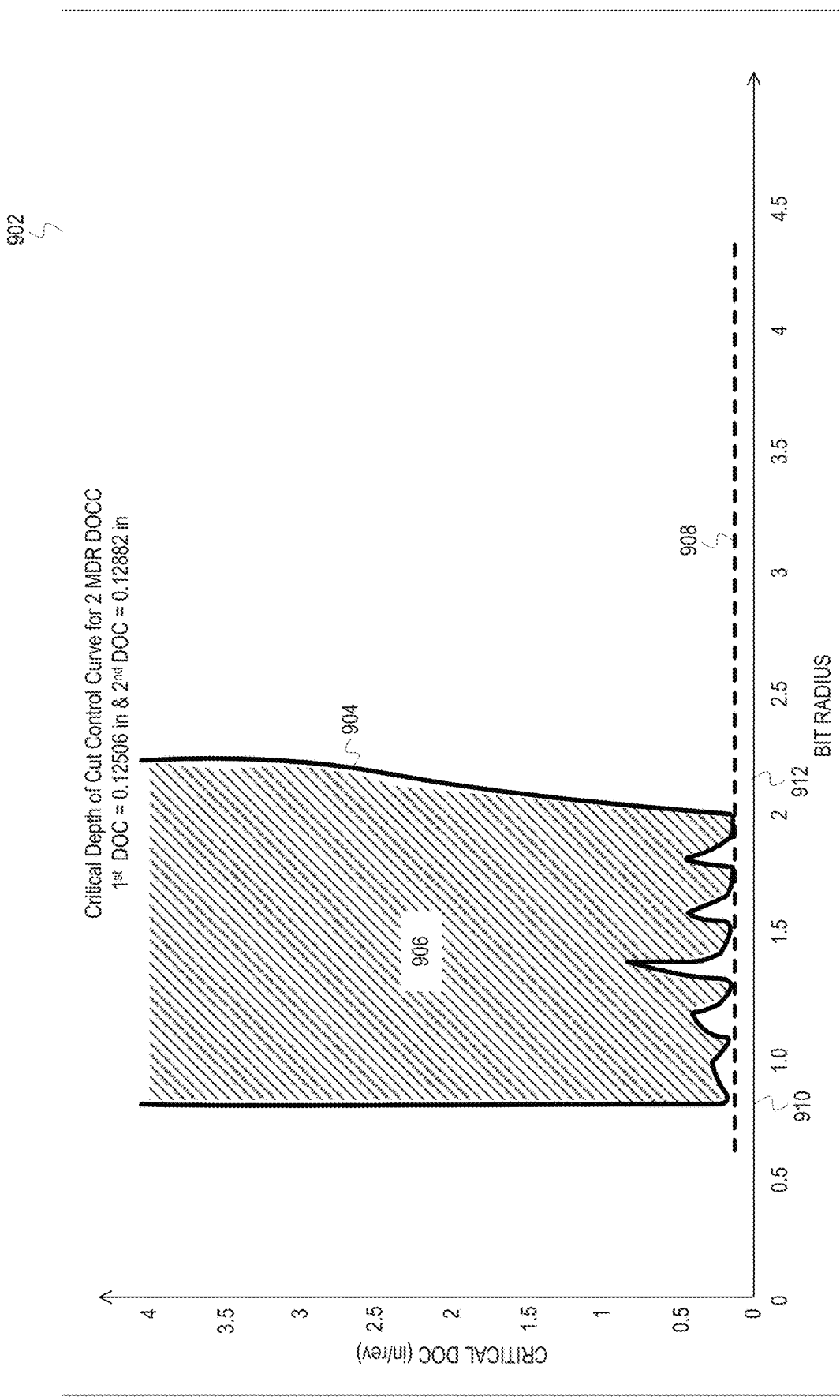
FIG. 9 illustrates an example relationship between critical depth of cut (CDOC) and depth control for an example PDC bit.

FIG. 9 illustrates an example relationship between critical depth of cut (CDOC) and depth control for an example PDC bit. Graph 902 depicts CDOC and DOCC engagement as a function of DOC in in/rev and location of DOCCs on the bit radius in inches (in) for an example PDC bit that contains two in-cone MDR-type DOCCs located on each blade. MDRs can function as cutters but provide depth of cut control in this example. The first DOCC has a CDOC of 0.12506 in and the second DOCC has a CDOC of 0.12882 in. The minimum CDOC, which is represented by curve 904, for the bit varies as a function of the MDR placement along the bit radius, which is a function of DOCC design. Within volume 906, which is an MDR engagement zone, MDRs are engaged with the formation and function to control DOC. Outside of the volume 906, the two in-cone MDRs do not control DOC—this is the non-controlled zone. Minimum CDOC is shown by dashed line 908, where the DOCCs come closest to the formation. Radius 910 indicated the most central location of the DOCCs on a blade, while radius 912 represents the nose or taper of the PDC bit. As the DOCC controllers move outside of the cone (i.e. as bit radius increases), CDOC increases because the DOCCs are further from the formation face that represents the borehole floor.

CDOC is both a PDC bit design parameter and a DOCC design parameter. As shown in FIG. 9, CDOC can be adjusted by placement of the DOCCs on the PDC bit within the cone. CDOC can also be adjusted by the number of DOCCs used (such as a pair versus a single DOCC) and by the DOCC size and projection from the bit surface or bit profile.

Figure 10:
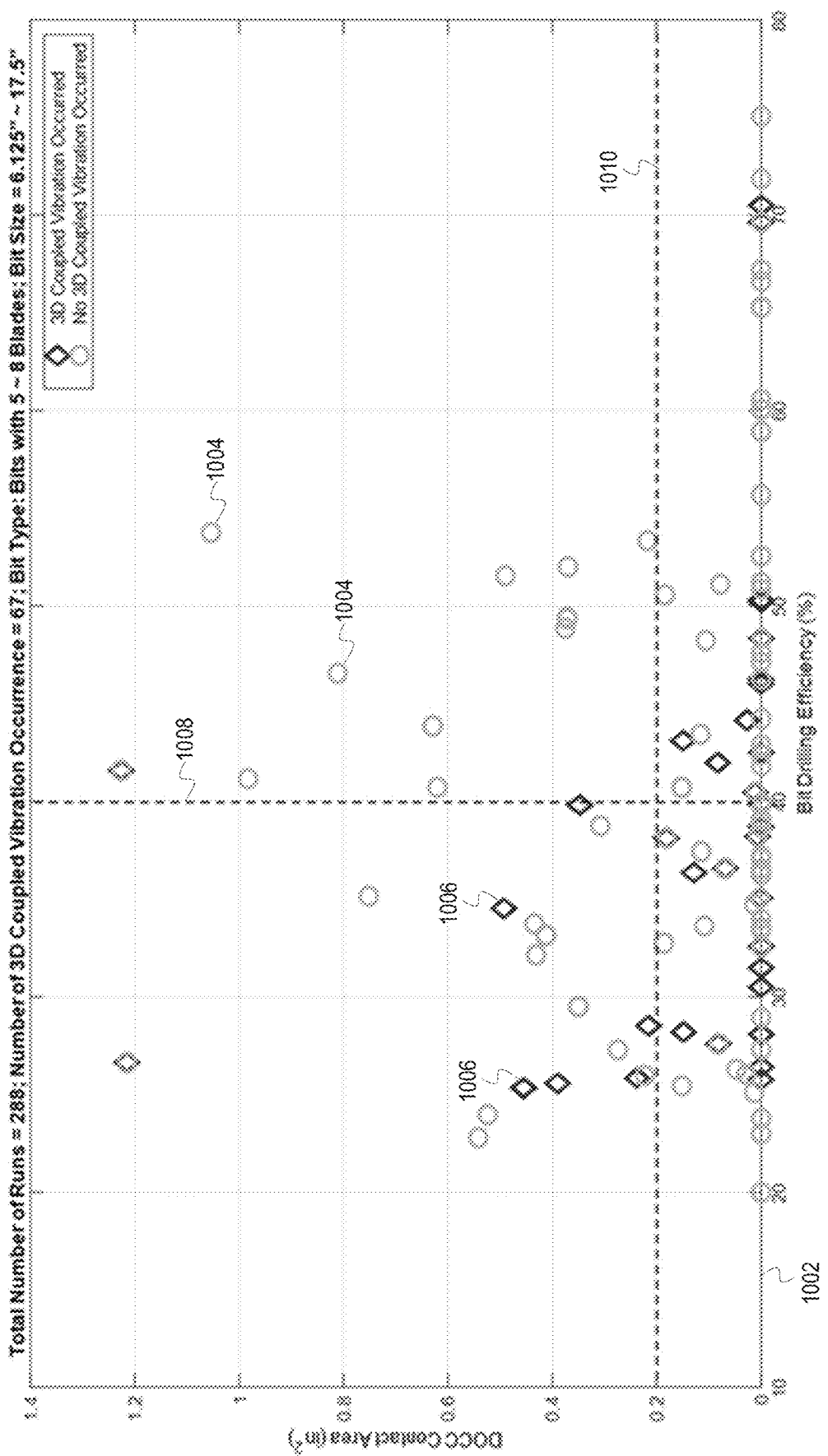
FIG. 10 depicts an example graph of detected coupled vibrations as a function of DOCC contact area and bit drilling efficiency (DE).

FIG. 10 depicts an example graph of detected coupled vibrations as a function of DOCC contact area and bit drilling efficiency (DE). Graph 1002 depicts a plot of 228 drilling runs as a function of bit DE (in 5% and DOCC contact area (in $in^2$). Drilling runs where no three-dimensional coupled vibrations were detected are represented by circles 1004, while the 67 drilling runs where three-dimensional coupled vibrations were detected are represented by diamonds 1006. PDC bits with five to eight blades and bit sizes between 6.126" and ~17.5" were used for the drilling runs plotted. Based on the prevalence of drilling runs with coupled vibrations and those without, vibration mitigation guidelines are developed. Line 1008 separates those runs where DE was below 40% and those were DE was above 40%, while line 1010 separates drilling runs where in-cone DOCC contact area was below 0.2 in and above 0.2 in. In the upper right quadrant of the graph, only one drilling run with coupled vibrations is detected (and that drilling run overlaps with another the parameters of another drilling run where coupled vibration was not detected). Therefore, three-dimensional coupled vibrations are mitigated for DE>40% and cone DOCC contact area greater than 0.2 $in^2$.

Figure 11:
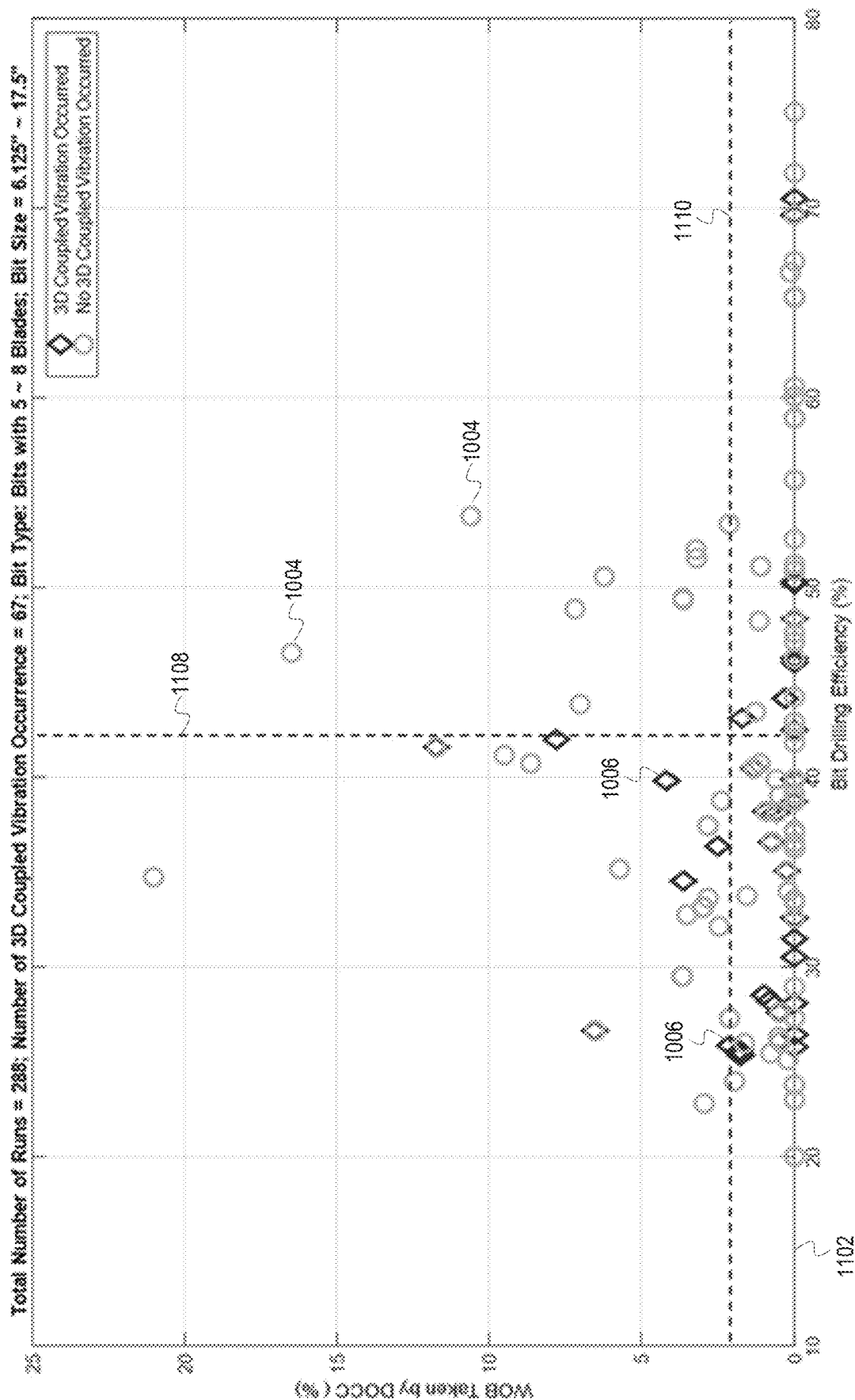
FIG. 11 depicts an example graph of detected coupled vibrations as a function of WOB taken off by a cone DOCC and bit DE.

FIG. 11 depicts an example graph of detected coupled vibrations as a function of WOB taken off by a cone DOCC and bit DE. Graph 1102 depicts a plot of 288 drilling runs, where three-dimensional coupled vibrations were detected in 67 of those drilling runs. Drilling runs were accomplished with PDC bits ranging in size between 6.125" and approximately 17.5" and with five to eight blades. Drilling runs without coupled vibrations are plotted as the circles 1004, while drilling runs with three-dimensional coupled vibrations are plotted as the diamonds 1006. Based on the plotted locations for drilling runs with three-dimensional coupled vibrations, PDC bit design guidelines can be generated in the DE vs. WOB taken off by in-cone DOCC design space. Line 1108 divides drilling runs with DE less than 42% and drilling runs with DE greater than 42%. Line 1110 divides drilling runs with WOB taken off by the DOCC greater than 2.0% and drilling runs with WOB taken off by the DOCC less than 2%. No drilling runs with coupled vibrations were detected in the upper right quadrant, where DE>42% and WOB taken off by in-cone DOCC is greater than 2%. Therefore, for this example, drill bit design guidelines can preferentially select PDC bit designs with DE greater than 42% and average WOB taken off by cone DOCC greater than 2% in order to mitigated coupled three-dimensional vibrations.

Figure 12:
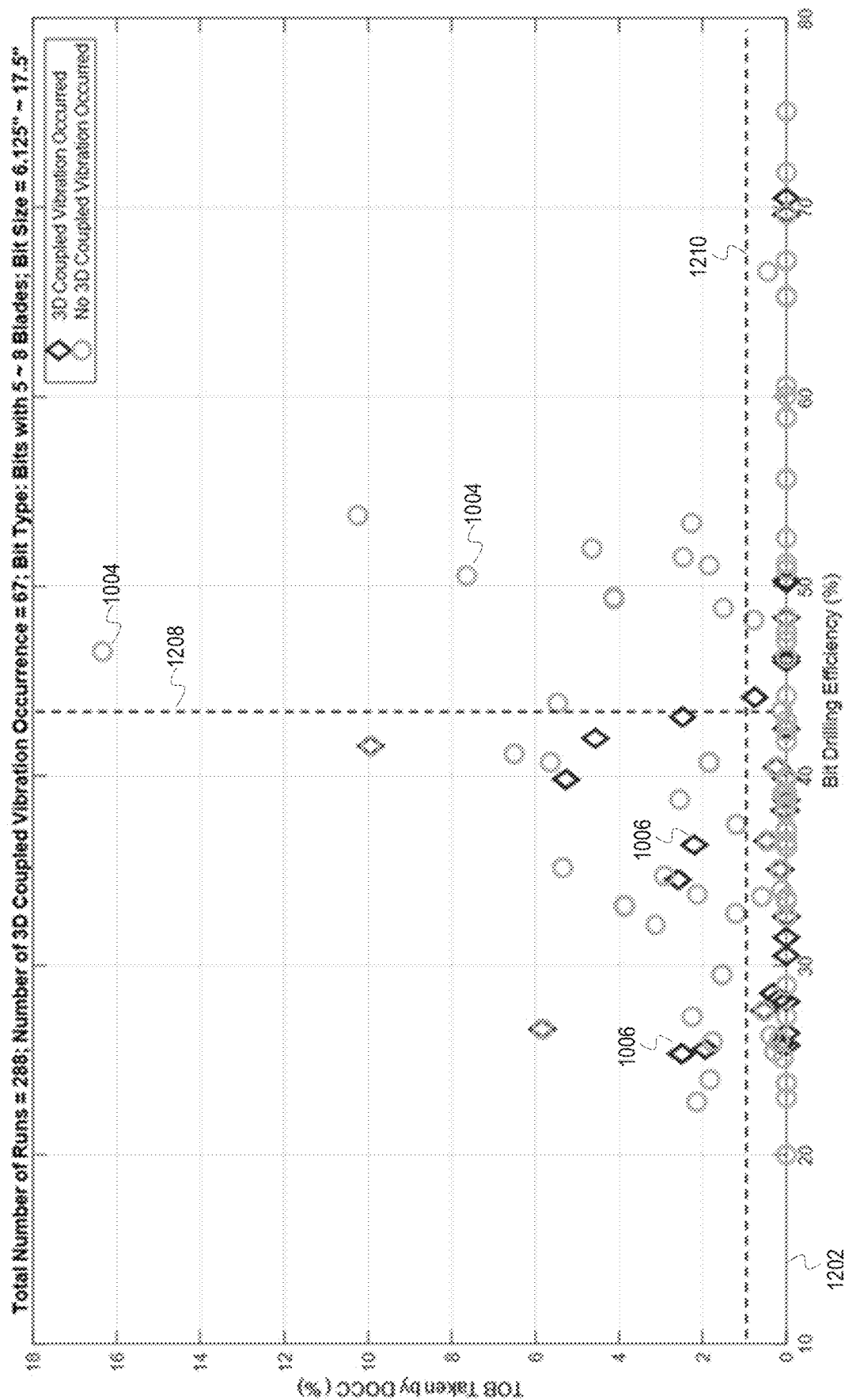
FIG. 12 depicts an example graph of detected coupled vibrations as a function of TOB taken off by a cone DOCC and bit DE.

FIG. 12 depicts an example graph of detected coupled vibrations as a function of TOB taken off by a cone DOCC and bit DE. Graph 1202 displays a plot of 288 drilling runs for PDC bits with five to eight blades and bit sizes of 6.125" to about 17.5". Drilling runs without coupled vibrations are represented as the circles 1004, while drilling runs with three-dimensional coupled vibrations are represented by the diamonds 1006. Line 1208 divides drilling runs with DE greater than 44% and drilling runs with DE smaller than 44%. Line 1210 divides drilling runs in which TOB taken off by the DOCC is greater than 1% and drilling runs in which TOB taken off by the DOC is less than 1%. No drilling runs with three-dimensional coupled vibrations lie in the upper right quadrant of the graph 1202, and therefore PDC drill bit design guidelines can be generated. Based on this example graph, PDC bits with greater than 44% DE and which take off greater than 1% of TOB have reduced likelihood of producing three-dimensional coupled vibrations.

Average characteristics of PDC drill bit design or DOCC design for mitigating or avoiding coupled vibrations can be calculated from a set drilling data including vibrational data. As an example, data from the same set of drilling runs is included in FIGS. 10, 11, and 12 (i.e. the same 288 runs for PDC drill bits with five to eight blades and bit size from 6.125" to ~17.5"). Based on this data set, average DOCC design parameters for vibration mitigation are calculated as a function of number of blades. For bits with five blades, where the DOC range is between 0 and 0.5 in/rev, the average CDOC for bits without vibration is less than 0.312 in/rev, the average DOCC contact area is 0.2609 in$^2$, the average WOB taken off by the DOCC is 3.5472%, and the average TOB taken off by the DOCC is 3.3468%. For bits with six blades (DOC range between 1 and 0.4 in/rev), the average CDOC for bits without vibration is less than 0.29 in/rev, the average DOCC contact area is greater than 0.3014 in$^2$, the average WOB taken off by the DOCC is greater than 2.8849%, and the average TOB taken off by the DOCC is greater than 2.3609%. For bits with seven or eight blades, where the DOC range is between 0 and 0.3 in/rev, the average CDOC for bits without vibration is less than 0.256 in/rev, the average DOCC contact area is greater than 0.2783 in$^2$, the average WOB taken off by the DOCC is greater than 1.6314%, and the average TOB taken off by the DOCC is greater than 1.4367%.

Design guidelines can be exclusionary, such as DE>44%, or can be based on averages or intervals, such as TOB taken off by the DOCC ~3.35%. Further, cone DOCC contact area, WOB taken off by in-cone DOCC, and TOB taken off by in-cone DOCC are interrelated quantities. Design rules or guidelines can be generated based on one or more of these quantities. Design guidelines can also comprise both minimal requirements and preferred ranges for one or more PDC bit design parameters. For instance, based on this data included in FIGS. 10-12, DE for primary and back up cutters should be greater than 44% in order to mitigate three-dimensional coupled vibrations. Additionally, minimal requirements are that in-cone DOCC contact area be greater than 0.2 in$^2$, WOB taken off by cone DOCC be greater than 2%, and TOB taken off by cone DOCC be greater than 1.0%. Average PDC bit design parameters from drilling runs without vibration can be selected as preferred values, such as those values discussed in the previous paragraph. The values given here and in reference to FIGS. 10-12 are examples and thresholds and functions can vary.

Figure 13:
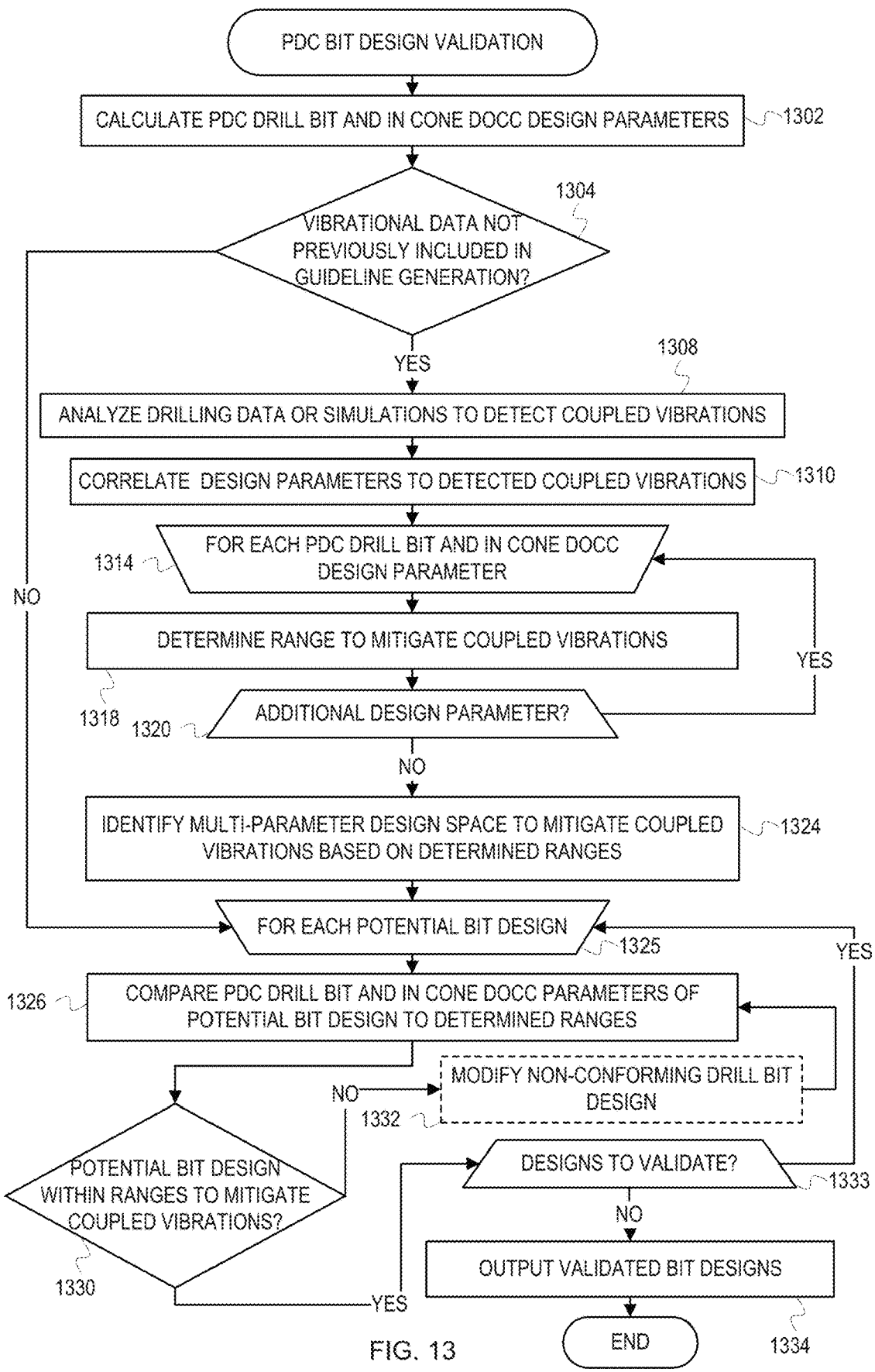
FIG. 13 is a flowchart of example operations quantifying PDC drill bit and in-cone DOCC design parameters for a drill bit design.

FIG. 13 is a flowchart of example operations for generating rules or guidelines to validate drill bit designs as mitigating coupled vibrations. A drill bit design validator can contain or be in communication with a drill bit design quantifier, which will be described in reference to FIG. 14. Optionally, the drill bit design validator can update previously generated drill bit design guidelines based on new drilling data.

At block 1302, the drill bit design validator calculates PDC drill bit and in-cone DOCC design parameters. The drill bit design validator can receive the PDC drill bit and in-cone DOCC design parameters from the drill bit design quantifier, can send detected drill bit designs to the drill bit design quantifier, or can include the drill bit design quantifier. The drill bit design validator can select each drill bit design included in a set of drill bit designs for validation or for which drilling data is included and quantify drill bit design parameters via the drill bit design quantifier. Quantify, quantifier, quantification and any grammatical form thereof hereafter mean to make explicit a numerical value or other variable value for a design parameter or bit characteristic that may or may not correlate directly or naturally to a single numerical value (for example, DOC is a function of changing drilling parameters and of many variables involved in drill bit design, but can be represented as at least one of a DOC range or CDOC).

PDC drill bit designs (including optional in-cone DOCCs) correspond to a plethora of quantifiable and adjustable measurements, dimensions, and angles: drill bit radius, cutter dimensions, number of cutters, rake angles, DOCC radial locations, etc. For simplicity, drill bit design characteristics will be used hereinafter to refer to the totality of measurable or adjustable dimensions, quantities, angles, types of components, etc. It can be impractical to correlate such a plurality of possible design characteristics to detected or observed drilling behavior. In order to correlate PDC drill bit and in-cone DOCC designs to instances of coupled vibrations, a PDC drill bit and corresponding in-cone DOCC design are correlated to one or more design parameters that quantify sets or subsets of one or more drill bit design characteristics. Design parameters allow PDC drill bit designs to be grouped into families (such as by number of blades) and allows overall effects of the individual PDC drill bit design characteristics to be correlated to drilling events.

At block 1304, the drill bit design validator determines if there is any new vibrational or drilling data with which to generate coupled vibration mitigation drill bit design guidelines. If there is no new data, flow continues to block 1326 and drill bit designs are validated based on previous or stored guidelines. If there is new data or no previously established design guidelines, for example when drill bit design guidelines are initially generated based on a set of drilling data, flow continues to block 1308.

At block 1308, the drill bit design validator analyzes drilling data from either real-world drilling measurements or from simulated drilling data, to detect instances of coupled vibrations. High frequency coupled vibrations are detected from measurements of axial, lateral, and torsional oscillation of the drill bit or BHA. Individual drilling runs can correspond to both the detection and the absence of coupled vibration, or drilling runs can correlate to coupled vibrations if any instance of coupled vibration is detected. Optionally, different types of coupled vibrations or high frequency coupled vibrations can be identified.

At block 1310, the drill bit design validator correlates PDC drill bit and in-cone DOCC design parameters of the drilled or simulated drill bits to instances of coupled vibrations and drilling runs without coupled vibrations. The drill bit design validator tags or selects the drill bit design parameters that correspond to drilling runs with detected vibrations. Alternatively, the drill bit validator can bin, batch, or group drilling run data into a set of drilling runs with detected coupled vibrations and a set of drilling data without detected coupled vibrations. The relationship can be a one to one determination of detected coupled vibrations for a set of design parameters, or can be a probability or likelihood of coupled vibrations based on detected coupled vibrations for similar design parameter values. For each drill bit design parameter of each drill bit and drilling run, calculated values are identified as corresponding to an instance of detected vibration or as corresponding to no detected coupled vibration. Drill bit design parameters may have the same or different values for different drilling runs of the same bit.

At block 1314, the drill bit design parameter validator selects one drill bit design parameter for determination. The drill bit design parameters can be interrelated and comprise one or more of: DE, CDOC, contact area of a DOCC, WOB taken off by a DOCC, TOB taken off by a DOCC, an average of any such parameter, etc. While design parameters may be interrelated (for example contact area of a DOCC is negligible for any DOC less than a CDOC), ranges of parameters which correlate to mitigated coupled vibrations may be related in unexpected ways. The drill bit validator analyzes a parameter separately to determine the range of values which correspond to mitigated coupled vibrations. Optionally, at least one design parameter (such as DE) is analyzed in correlation with each other design parameter such that relationships between mitigation ranges for one or more parameters. are calculated.

At block 1318, the drill bit design parameter validator determines a range of the selected design parameter that corresponds to mitigated coupled vibrations. The drill bit design validator determines a range of values for vibration mitigation based on the values of the PDC drill bit and in-cone DOCC design parameters for which coupled vibrations are not detected, as compared to the values of the design for which coupled vibrations are detected. The determined range can be open ended (i.e. all values above a threshold are allowable), can be closed (i.e. only values above a lower threshold and below an upper threshold are allowable), or can correspond to an ideal value and values near such a mean or median for suppression of coupled vibrations. The determined range can be based on absence of coupled vibration, infrequency of coupled vibrations, or determination of the presence of a smaller magnitude of coupled vibrations. The drill bit design validator determines, based on PDC drill bit and in-cone DOCC design parameters identified as corresponding to detected coupled vibrations, a set of values including each bit design and performance parameter that are related to coupled vibrations. Design guidelines can be exclusionary, such that any design parameter value for which coupled vibrations are detected is removed from the multi-dimensional design parameter space (optionally including a range of values surrounding the value for which coupled vibrations are detected). Design rules or guidelines can be generated based on one or more design parameters. Design guidelines can also comprise both minimal requirements and preferred ranges for one or more PDC bit design parameters. Average, median, or mean PDC bit design parameters from drilling runs without detected coupled vibration or midpoint or other point within a range can be selected as preferred values for PDC bit design parameters. In order to mitigate coupled vibrations, instances of detected coupled vibrations are controlling on design parameters values—i.e. the presence of any detected coupled vibration for a drill bit design parameter predisposes that value for exclusion unless enough data at or near that value shows that detected coupled vibration is unlikely, such as many other drilling runs for which that value corresponds to instances where no coupled vibration is detected.

At block 1320, the drill bit design parameter validator determines if any further drill bit design parameters remain to be analyzed. One or more design parameters have not been analyzed, flow continues to the design parameter range determination loop at block 1314. If all design parameters have been analyzed, flow continues to block 1324.

At block 1324, the drill bit design parameter validator identifies a multi-dimensional design space for coupled vibration mitigation based on determined ranges for the one or more design parameters. The drill bit design validator can identify a range, limit, or multi-dimensional space in one or more drill bit design parameters for which there are no (or statistically few) detected coupled vibrations. The multi-dimensional design space is identified by comparing the determined values for all drill bit design parameters. The multi-dimensional space is the set of values or range of values across all compared drill bit design parameters, where a drill bit with design parameters falling within that space, is expected to be free from coupled vibrations or where previous designs within that space experienced no detected coupled vibrations. In some cases, mitigation ranges in one design parameter can correspond to instances of high vibrational likelihood in another parameter—since design parameters can be interrelated. In such cases, the multi-dimensional design space for coupled vibration mitigation omits any regions where one or more variables lies outside a range of mitigated vibration. The multi-dimensional space where vibration is mitigated is output or stored as a set of design rules or guidelines which outline values of design parameters for which coupled vibrations are absent, not detected, or reduced. Optionally, flow continues from block 1324 to block 1325 and potential or new PDC drill bit designs are validated against the guidelines for mitigated vibration.

At block 1325, the drill bit design validator selects a new or potential drill bit design for validation. The drill bit design parameters, generated in block 1302, are compared against the drill bit design rules or guidelines that identify the multi-dimensional design space for which coupled vibrations are mitigated. Each new or potential design bit is compared, as a function of its identified drill bit design parameters, to the multi-dimensional design space.

At block 1326, the drill bit design validator compares PDC drill bit design parameters and DOCC design parameters of the selected potential drill bit design to the design parameter guidelines generated at block 1324. The drill bit design validator can compare the drill bit design parameters to one or more thresholds in the PDC drill bit and in-cone DOCC design parameters. Optionally, the drill bit design validator can compare the drill bit design parameters to one or more preferred ranges in the PDC drill bit and in-cone DOCC design parameters. The drill bit design validator can identify drill bit designs that do not correspond to one or more minimum thresholds for coupled vibration mitigation, drill bit designs that correspond to all minimum thresholds for coupled vibration mitigation, and drill bit designs that correspond to one or more preferred ranges for coupled vibration mitigation. From block 1326 flow continues to block 1330.

At block 1330, the drill bit design validator decides, for each PDC drill bit design, if the drill bit design parameters conform to the design guidelines for mitigated coupled vibration. The drill bit design validator operates on the comparison of block 1326 to determine if the new or potential drill bit design lies within the multi-dimensional design space for mitigated vibrations. The drill bit design validator can validate design for minimum thresholds for vibration mitigation, or for preferred thresholds for vibration mitigation. The drill bit design validator can optionally identify both minimum and preferred designs. For the drill bit designs which do not conform to the rules or guidelines outlining the multi-dimensional space for coupled vibration mitigation, they can be discarded or (optionally where flow continues to block 1332) be adjusted to produce validated designs. For the drill bit designs conform to the guidelines, flow continues to block 1333 where validated designs are grouped or stored as a set of validated drill bit designs.

At block 1332, the drill bit design validator optional adjusts or causes to be adjusted one or more design parameter for a potential PDC drill bit design that does not conform to the multi-dimensional design space for coupled vibration mitigation. Such adjustment can comprise adjusting a PDC drill bit or in-cone DOCC design parameter that directly corresponds to one or more physical dimensions of the drill bit (i.e. CDOC) or can comprise adjusting a design parameter (such as average TOB taken off by an in-cone DOCC) where such as adjustment comprises calculating or adjusting one or more physical dimensions (i.e. back rake angle) of the drill bit and recalculating the design parameter for the new or adjusted drill bit design. The modification can include a calculation or re-calculation of the PDC bit and in-cone DOCC design parameters, such as the calculation that occurs at block 1302, for the new or adjusted bit design. From block 1332, flow continues to block 1326, where the drill bit validator compares the modified or adjusted drill bit design to the generated guidelines. The drill bit design validator can adjust a non-conforming drill bit in one or more iteration, until such time as a maximum iteration count is reached or the drill bit design is validated at block 1330.

At block 1333, the drill bit design validator determines if every new or potential bit design has been validated. If more new or potential drill bit designs remain to be validated, flow continues to block 1325 where a new drill bit design is selected for validation. When all new or potential drill bit designs have been validated or discarded, flow continues to block 1334.

At block 1334, the drill bit design validator outputs or stores validated PDC drill bit designs for mitigated coupled vibration. The drill bit design validator can also output those of the drill bit designs which are not validated as a separate data set or file. Optionally, drill bit design parameters such as DOC, WOB, TOB, etc. can be modified during drilling based on real time measurement of drill bit or BHA vibration. Average drill bit parameters or averages over DOC ranges are relatively independent of drilling conditions. However, adjustments to drilling parameters such as RPM, ROB, WOB, TOB, etc. can shift DOCC contact area, WOB taken off by an in-cone DOCC, TOB taken off by an in-cone DOCC, etc. and therefore also effect averages over a DOC range. The drill bit design validator can optionally include a module for drilling parameter control, where the drill bit design validator controls or recommends drilling adjustment such that a specific drill bit is operated within the multi-dimensional space for vibration mitigation.

Figure 14:
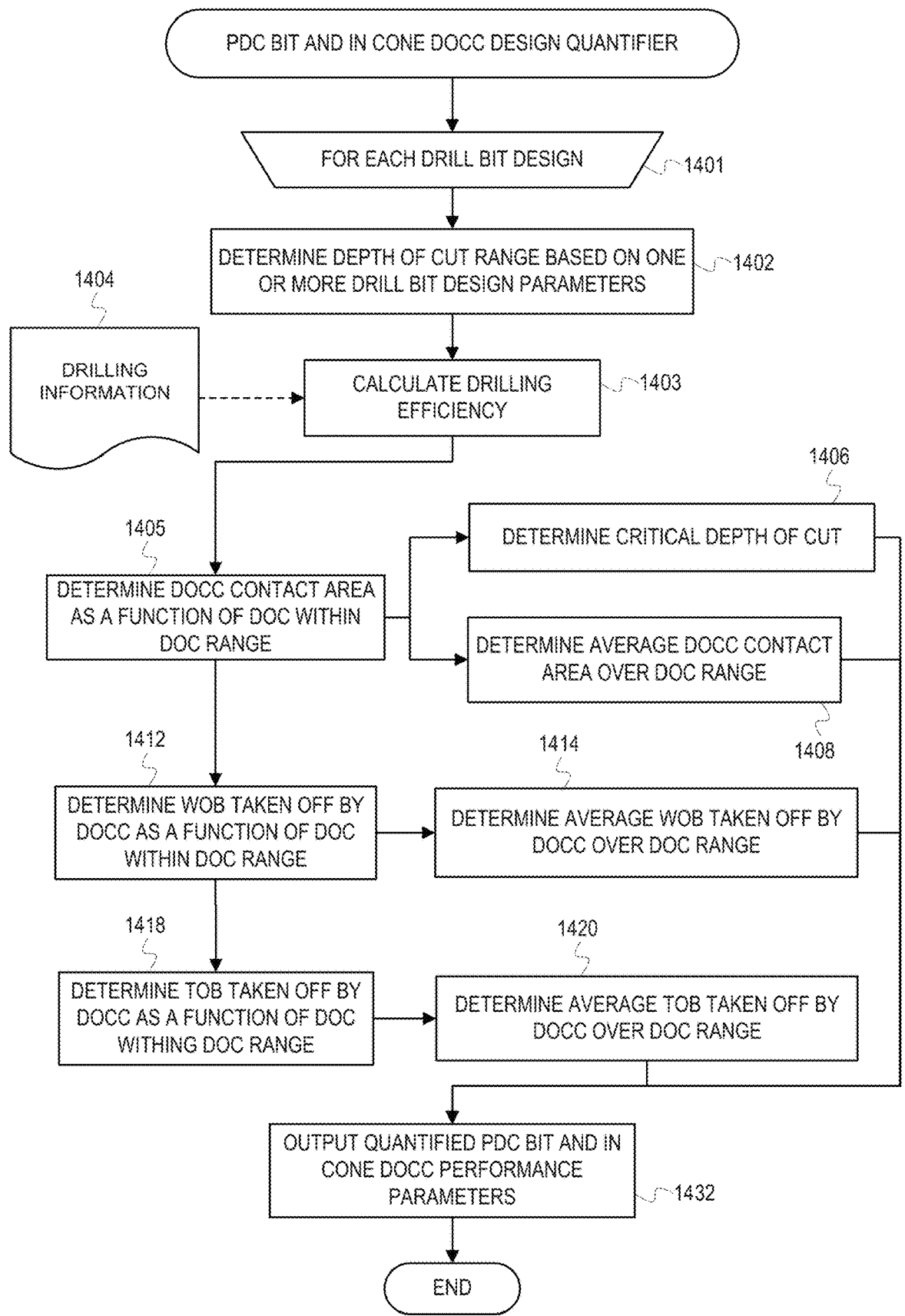
FIG. 14 is a flowchart of example operations for generating rules or guidelines to validate drill bit designs as mitigating coupled vibrations.

FIG. 14 is a flowchart of example operations quantifying PDC drill bit and in-cone DOCC design parameters for a drill bit design. The drill bit design quantifier calculates design parameters, such as CDOC, average DOCC contact area, average WOB taken off by DOCC, average TOB taken off by DOCC, etc. for individual drill bit designs or groups of design in order to correlate drill bit design parameter to instances of coupled vibration and to instances where no coupled vibration is detected.

At block 1401, the drill bit design quantifier selects a drill bit design for quantification. If more than one drill bit design is input to the quantifier, the drill bit design quantifier operates on each drill bit design separately.

At block 1402, the drill bit design quantifier determines a depth of cut (DOC) range for a selected drill bit design. The DOC range can be calculated based on drilling data for the selected drill bit design, if the selected drill bit has been drilled or used in drilling. The DOC range can be calculated or estimated based on one or more drill bit design characteristics—which as previously defined can include design parameters or can be other drill bit design measurements, dimensions, angles, etc. such as number of blades. The DOC range can be estimated based on drilling data from similar drill bits or can be measured from simulated drilling data. The DOC range represents the various DOCs the drill bit is predicted to experience within the normal course of drilling conditions. The drill bit design quantifier averages a variety of design parameters of the DOC range in order to generate measurements of the relationship between design parameters and DOCC interaction with the borehole bottom.

At block 1403, the drill bit design quantifier calculates an average drilling efficiency (DE) for the drill bit. DE can be estimated from drilling data, such as drilling data contained within a drilling information data set 1404, including from similar drill bits, can be calculated from drilling data, or determined based on simulation of drilling runs. Simulated drilling data can output a drilling efficiency or average drilling efficiency that is independent of formation type. Drilling information 1404 can including one or more drilling parameter (RPM, ROP, WOB, TOB, etc.) for the PDC bit design, which can be used to calculate a drilling efficiency. The drill bit design quantifier correlates DE to the drill bit design and stores or outputs the DE to PDC bit design parameters at block 1432

At block 1405, the drill bit design quantifier determines a DOCC contact area as a function of DOC for an in-cone DOCC. The DOCC contact area for an in-cone DOCC changes as a function of DOC, as shown in FIG. 6. The DOCC contact area is a measurement of the surface area of interaction between the formation and any in-cone DOCCs. In-cone DOCCs have been shown to mitigate interaction between the BHA and the borehole bottom, including disrupting harmonic and coupled vibrations. From block 1405, flow continues to block 1406 (where CDOC is determined) and block 1408 (where average DOCC contact area over the DOC range is determined), and optionally to block 1412 and block 1418. The processes by which average DOCC contact area over the DOC range, average WOB taken off by a DOCC over the DOC range, and average TOB taken off by a DOCC over the DOC range are calculated are shown in parallel. Optionally, because such values are interrelated, one average can be calculated from one or more other average.

At block 1406, the drill bit design quantifier determines a critical DOC (CDOC) based on the DOCC contact area as a function of DOCC. The CDOC can be measured, estimated from drilling data, calculated from simulations of drilling, or calculated from DOCC contact area as a function of DOC. CDOC can be calculated based on the distance from the deepest projection of the drill bit to the deepest projection of the DOCC, or can be estimated from the smallest DOC where the DOCC contacts the formation face. CDOC can be calculated from the slope of the cone DOCC contact area as a function of DOC, where the cone DOCC contact area is zero for all values smaller than the CDOC and nonzero for all values larger than the CDOC. The drill bit design quantifier correlates CDOC to the drill bit design and stores or outputs the CDOC to PDC bit design parameters for the bit design at block 1432.

At block 1408, the drill bit design quantifier determines an average DOCC contact area over the DOC range for an in-cone DOCC. The average DOCC contact area accounts for the contact area over the range of DOC the drill is presumed to experience during drilling. The drill bit design quantifier correlates average DOCC contact area to the drill bit design and stores or outputs the average DOCC contact area to PDC bit design parameters for the bit design at block 1432.

At block 1412, the drill bit design quantifier determines WOB taken off by an in-cone DOCC as a function of DOC. The WOB taken off by an in-cone DOCC changes as a function of DOC, as shown in FIG. 7. The WOB taken off by an in-cone DOCC measures the pressure applied to the formation by the in-cone DOCC and increases as a function of depth of cut. From block 1312, flow continues to block 1414 (where average WOB taken off by a DOCC over the DOC range is calculated) and block 1418.

At block 1414, the drill bit design quantifier determines an average WOB taken off by an in-cone DOCC over the DOC range. The average WOB taken off by an in-cone DOCC accounts for the expected DOC. The drill bit design quantifier correlates average WOB taken off by an in-cone DOCC to the drill bit design and stores or outputs the average WOB taken off by the DOCC to PDC bit design parameters for the drill bit at block 1432.

At block 1418, the drill bit design quantifier determines TOB taken off by an in-cone DOCC as a function of DOC. The TOB taken off by an in-cone DOCC changes as a function of DOC as shown in FIG. 8. The TOB taken off by an in-cone DOCC measures the torque applied to the formation by the in-cone DOCC and increases as a function of depth of cut. From block 1418, flow continues to block 1420 (where average TOB taken off by a DOCC over the DOC range is calculated).

At block 1420, the drill bit design quantifier determines an average TOB taken off by an in-cone DOCC over the DOC range. The average TOB taken off by an in-cone DOCC accounts for the expected DOC. The drill bit design quantifier correlates average TOB taken off by an in-cone DOCC to the drill bit design and stores or outputs the average TOB taken off by the DOCC to PDC bit design parameters for the drill bit design at block 1432.

At block 1432, the drill bit design quantifier stores or outputs PDC bit design parameters associated with the drill bit design. The PDC bit design parameters can be output to the drill bit design validator, as discussed in reference to FIG. 13, or can be tagged or otherwise linked or identified as corresponding to each of the drill bit designs. A drill bit design, simulation of a drill bit design performance, or drilled drill bit together with its drilling data can be tagged or otherwise correlated with PDC bit design parameters for later use or validation. The DOCC design parameters shown here can be calculated in any order and may comprise more parameters or a subset of the parameters identified here. Optionally WOB taken off by the cone DOCC and TOB taken off by the cone DOCC can be omitted, or only one value calculated. The DOCC design parameters can be averaged over the expected DOC range or can be calculated for measured DOC from drilling data.

The example operations are described with reference to drill bit design quantifier and drill bit design validator for consistency with the earlier figure(s). The name chosen for the program code is not to be limiting on the claims. Structure and organization of a program can vary due to platform, programmer/architect preferences, programming language, etc. In addition, names of code units (programs, modules, methods, functions, etc.) can vary for the same reasons and can be arbitrary.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 1412 and 1418 can be performed in parallel or concurrently. With respect to FIG. 13, a modification of a potential drill bit design is not necessary. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine-readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium.

A machine-readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 15:
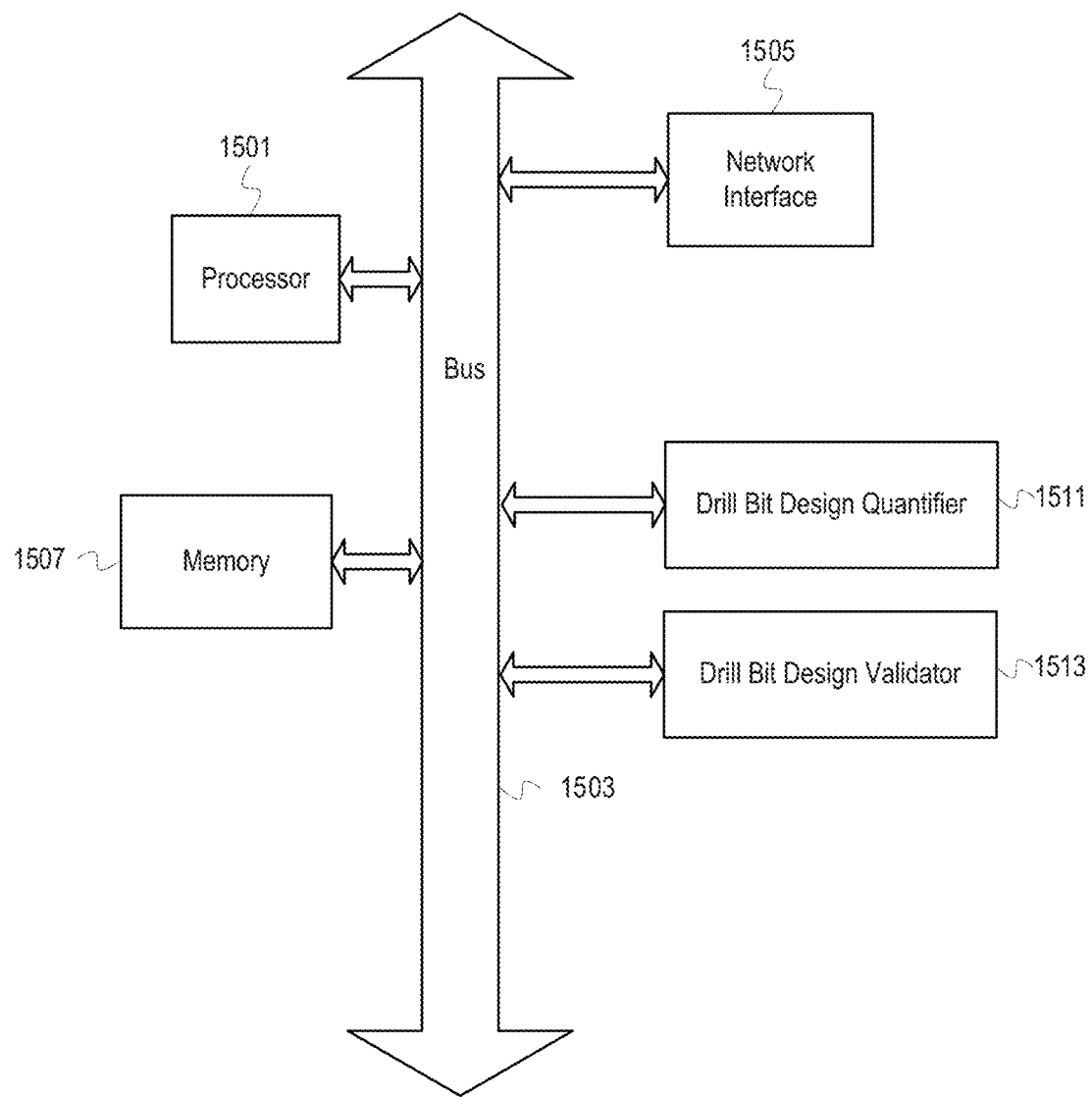
FIG. 15 depicts an example computer system with a drill bit design quantifier and a drill bit design validator.

FIG. 15 depicts an example computer system with a drill bit design quantifier and a drill bit design validator. The computer system includes a processor 1501 (possibly including multiple processors, multiple cores, multiple nodes, and/or implementing multi-threading, etc.). The computer system includes memory 1507. The memory 1507 may be system memory or any one or more of the above already described possible realizations of machine-readable media. The computer system also includes a bus 1503 and a network interface 1505. The system also includes drill bit design validator 1511 and drill bit design validator 1513. The drill bit design quantifier 1511 quantifies drill bit designs by generating values of drill bit design parameters. The drill bit design validator 1513 generated guidelines for drill bit design parameters where coupled vibrations are mitigated and test or validates drill bit designs against such guidelines. The drill bit design quantifier 1511 can be a part of the drill bit design validator 1513. Any one of the previously described functionalities may be partially (or entirely) implemented in hardware and/or on the processor 1501. For example, the functionality may be implemented with an application specific integrated circuit, in logic implemented in the processor 1501, in a co-processor on a peripheral device or card, etc. Further, realizations may include fewer or additional components not illustrated in FIG. 15 (e.g., video cards, audio cards, additional network interfaces, peripheral devices, etc.). The processor 1501 and the network interface 1505 are coupled to the bus 1503. Although illustrated as being coupled to the bus 1503, the memory 1507 may be coupled to the processor 1501.

While the aspects of the disclosure are described with reference to various implementations and exploitations, it will be understood that these aspects are illustrative and that the scope of the claims is not limited to them. In general, techniques for drill bit design quantification and validation as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

EXAMPLE EMBODIMENTS

Embodiment 1

A method comprising: calculating values for a first depth of cut controller design parameter for a plurality of drill bit designs; based on drilling data, correlating instances of coupled vibrations to values of the first depth of cut controller design parameter; based on the correlating, determining a set of one or more limits for the first depth of cut controller design parameter that mitigates occurrences of coupled vibrations; and generating drill bit design rules based, at least in part, on the determined set of one or more limits for the first depth of cut controller design parameters.

Embodiment 2

The method of embodiment 1 further comprising: validating a drill bit design based, at least in part, on the generated drill bit design rules, wherein validating comprises determining that a value for the first depth of cut controller design parameter for the drill bit design lies within the set of one or more limits for values of the first depth of cut controller design parameters that mitigate occurrences of coupled vibrations.

Embodiment 3

The method of embodiment 2 further comprising: based on a determination that the drill bit design is not valid, adjusting the drill bit design based, at least in part, on a difference between the value of the first depth of cut controller design parameter and the set of one or more limits for values of the first depth of cut controller design parameters that mitigate occurrences of coupled vibrations.

Embodiment 4

The method of any one of embodiments 1 to 3 wherein coupled vibrations comprise vibrations detected at a substantially similar frequency across two or more axes.

Embodiment 5

The method of embodiment 4 wherein axes comprise an axial axis, a lateral axis, and a torsional axis.

Embodiment 6

The method of any one of embodiments 1 to 5 wherein coupled vibrations further comprise high frequency coupled vibrations.

Embodiment 7

The method of any one of embodiments 1 to 6 wherein drilling data comprises at least one of vibrational data from drilling runs in a formation and vibrational data from simulated drilling runs.

Embodiment 8

The method of any one of embodiment 1 to 7 wherein the first depth of cut controller design parameter comprises at least one of a depth of cut, a critical depth of cut, a drilling efficiency, a depth of cut range, weight on bit taken off by a depth of cut controller, torque on bit taken off by a depth of cut controller, average weight on bit taken off by a depth of cut controller, and average torque on bit taken off by a depth of cut controller.

Embodiment 9

The method of any one of embodiments 1 to 8, further comprising: calculating values for a second depth of cut controller design parameter for a plurality of drill bit designs; based on drilling data, correlating instances of coupled vibrations to values of the second depth of cut controller design parameter; based on the correlating, determining a set of one or more limits for the second depth of cut controller design parameter that mitigates occurrences of coupled vibrations; and wherein generating drill bit design rules further comprises generating drill bit design rules based, at least in part, on the determined set of one or more limits for the first depth of cut controller design parameters and the determined set of one or more limits for the second depth of cut controller design parameter.

Embodiment 10

The method of embodiment 9, wherein generating drill bit design rules based, at least in part, on the determined set of one or more limits for the first depth of cut controller design parameters and the determined set of one or more limits for the second depth of cut controller design parameter comprises generating a multi-parameter design space wherein coupled vibrations are mitigated.

Embodiment 11

A non-transitory, computer-readable medium having instructions stored thereon that are executable by a computing device, the instructions to: calculate values for a first depth of cut controller design parameter for a plurality of drill bit designs; based on drilling data, correlate instances of coupled vibrations to values of the first depth of cut controller design parameter; based on the correlation, determine a set of one or more limits for the first depth of cut controller design parameter that mitigates occurrences of coupled vibrations; and generate drill bit design rules based, at least in part, on the determined set of one or more limits for the first depth of cut controller design parameters.

Embodiment 12

The non-transitory, computer-readable media of embodiment 11, wherein the instructions further comprise instructions to: validate a drill bit design based, at least in part, on the generated drill bit design rules, wherein validation comprises instructions to determine that a value for the first depth of cut controller design parameter for the drill bit design lies within the set of one or more limits for values of the first depth of cut controller design parameters that mitigate occurrences of coupled vibrations; and based on a determination that the drill bit design is not valid, adjust the drill bit design based, at least in part, on a difference between the value of the first depth of cut controller design parameter and the set of one or more limits for values of the first depth of cut controller design parameters that mitigate occurrences of coupled vibrations.

Embodiment 13

The non-transitory, computer-readable media of embodiment 11 or 12, wherein coupled vibrations comprise high frequency vibrations detected at a substantially similar frequency across at least two of axial, lateral, and torsional axes.

Embodiment 14

The non-transitory, computer-readable media of any one of embodiments 11 to 13, wherein the first depth of cut controller design parameter comprises at least one of a depth of cut, a critical depth of cut, a drilling efficiency, a depth of cut range, weight on bit taken off by a depth of cut controller, torque on bit taken off by a depth of cut controller, average weight on bit taken off by a depth of cut controller, and average torque on bit taken off by a depth of cut controller.

Embodiment 15

The non-transitory, computer-readable media of any one of embodiments 11 to 14, wherein the instructions further comprise instructions to: calculate values for a second depth of cut controller design parameter for a plurality of drill bit designs; based on drilling data, correlate instances of coupled vibrations to values of the second depth of cut controller design parameter; based on the correlation, determine a set of one or more limits for the second depth of cut controller design parameter that mitigates occurrences of coupled vibrations; and wherein instructions to generate drill bit design rules further comprise instruction to generate drill bit design rules based, at least in part, on the determined set of one or more limits for the first depth of cut controller design parameters and the determined set of one or more limits for the second depth of cut controller design parameter.

Embodiment 16

The non-transitory, computer-readable media of embodiment 15, wherein instructions to generate drill bit design rules based, at least in part, on the determined set of one or more limits for the first depth of cut controller design parameters and the determined set of one or more limits for the second depth of cut controller design parameter comprise instructions to generate a multi-parameter design space wherein coupled vibrations are mitigated.

Embodiment 17

An apparatus comprising: a processor; and a computer-readable medium having instructions stored thereon that are executable by the processor to cause the apparatus to, calculate values for a first depth of cut controller design parameter for a plurality of drill bit designs; based on drilling data, correlate instances of coupled vibrations to values of the first depth of cut controller design parameter; based on the correlation, determine a set of one or more limits for the first depth of cut controller design parameter that mitigates occurrences of coupled vibrations; and generate drill bit design rules based, at least in part, on the determined set of one or more limits for the first depth of cut controller design parameters.

Embodiment 18

The apparatus of embodiment 17, further comprising instructions to: validate a drill bit design based, at least in part, on the generated drill bit design rules, wherein validation comprises instructions to determine that a value for the first depth of cut controller design parameter for the drill bit design lies within the set of one or more limits for values of the first depth of cut controller design parameters that mitigate occurrences of coupled vibrations; and based on a determination that the drill bit design is not valid, adjust the drill bit design based, at least in part, on a difference between the value of the first depth of cut controller design parameter and the set of one or more limits for values of the first depth of cut controller design parameters that mitigate occurrences of coupled vibrations.

Embodiment 19

The apparatus of embodiment 17 or 18, wherein coupled vibrations comprise high frequency vibrations detected at a substantially similar frequency across at least two of axial, lateral, and torsional axes.

Embodiment 20

The apparatus of any one of embodiments 17 to 19, further comprising instructions to: calculate values for a second depth of cut controller design parameter for a plurality of drill bit designs; based on drilling data, correlate instances of coupled vibrations to values of the second depth of cut controller design parameter; based on the correlation, determine a set of one or more limits for the second depth of cut controller design parameter that mitigates occurrences of coupled vibrations; and wherein instructions to generate drill bit design rules further comprise instruction to generate a multi-parameter design space wherein coupled vibrations are mitigated based, at least in part, on the determined set of one or more limits for the first depth of cut controller design parameters and the determined set of one or more limits for the second depth of cut controller design parameter.

Terminology

As used herein, the term "or" is inclusive unless otherwise explicitly noted. Thus, the phrase "at least one of A, B, or C" is satisfied by any element from the set {A, B, C} or any combination thereof, including multiples of any element.

The invention claimed is:

1. A method comprising:
calculating values for first and second depth of cut controller design parameters for a plurality of drill bit designs;
based on drilling data, correlating instances of coupled vibrations to values of the first and second depth of cut controller design parameters;
based on the correlating, determining a set of one or more limits for the first and second depth of cut controller design parameters that mitigate occurrences of coupled vibrations;
generating drill bit design rules based, at least in part, on the one or more limits for the first and second depth of cut controller design parameters, wherein the drill bit design rules include generating a multi-parameter design space wherein coupled vibrations are mitigated; and
producing a drill bit with minimum of coupled vibration when used in a drilling run in a formation based on the drill bit design rules.

2. The method of claim 1 further comprising:
validating a drill bit design based, at least in part, on the generated drill bit design rules, wherein validating comprises determining that a value for the first and second depth of cut controller design parameters for the drill bit design lies within the set of one or more limits for values of the first and second depth of cut controller design parameters that mitigate occurrences of coupled vibrations.

3. The method of claim 2 further comprising:
based on a determination that the drill bit design is not valid, adjusting the drill bit design based, at least in part, on a difference between the value of the first and second depth of cut controller design parameters and the set of one or more limits for values of the first and second depth of cut controller design parameters that mitigate occurrences of coupled vibrations.

4. The method of claim 1 wherein coupled vibrations comprise vibrations detected at a substantially similar frequency across two or more axes.

5. The method of claim 4 wherein axes comprise an axial axis, a lateral axis, and a torsional axis.

6. The method of claim 1 wherein coupled vibrations further comprise high frequency coupled vibrations.

7. The method of claim 1 wherein drilling data comprises at least one of vibrational data from drilling runs in a formation and vibrational data from simulated drilling runs.

8. The method of claim 1 wherein the first and second depth of cut controller design parameters comprise at least one of a depth of cut, a critical depth of cut, a drilling efficiency, a depth of cut range, weight on bit taken off by a depth of cut controller, torque on bit taken off by a depth of cut controller, average weight on bit taken off by a depth of cut controller, and average torque on bit taken off by a depth of cut controller.

9. A non-transitory, computer-readable medium having instructions stored thereon that are executable by a computing device, the instructions to:
calculate values for first and second depth of cut controller design parameters for a plurality of drill bit designs;
based on drilling data, correlate instances of coupled vibrations to values of the first and second depth of cut controller design parameters;
based on the correlation, determine a set of one or more limits for the first and second depth of cut controller design parameters that mitigate occurrences of coupled vibrations;
generate drill bit design rules based, at least in part, on the one or more limits for the first and second depth of cut controller design parameters, wherein the drill bit design rules include generating a multi-parameter design space wherein coupled vibrations are mitigated; and
produce a drill bit with minimum of coupled vibration when used in a drilling run in a formation based on the drill bit design rules.

10. The non-transitory, computer-readable media of claim 9, wherein the instructions further comprise instructions to:
validate a drill bit design based, at least in part, on the generated drill bit design rules, wherein validation comprises instructions to determine that a value for the first and second depth of cut controller design parameters for the drill bit design lies within the set of one or more limits for values of the first and second depth of cut controller design parameters that mitigate occurrences of coupled vibrations; and
based on a determination that the drill bit design is not valid, adjust the drill bit design based, at least in part, on a difference between the value of the first and second depth of cut controller design parameters and the set of one or more limits for values of the first and second depth of cut controller design parameters that mitigate occurrences of coupled vibrations.

11. The non-transitory, computer-readable media of claim 9, wherein coupled vibrations comprise high frequency vibrations detected at a substantially similar frequency across at least two of axial, lateral, and torsional axes.

12. The non-transitory, computer-readable media of claim 9, wherein the first and second depth of cut controller design parameters comprise at least one of a depth of cut, a critical depth of cut, a drilling efficiency, a depth of cut range, weight on bit taken off by a depth of cut controller, torque on bit taken off by a depth of cut controller, average weight on bit taken off by a depth of cut controller, and average torque on bit taken off by a depth of cut controller.

13. An apparatus comprising:
a processor; and a computer-readable medium having instructions stored thereon that are executable by the processor to cause the apparatus to,
calculate values for first and second depth of cut controller design parameters for a plurality of drill bit designs;
based on drilling data, correlate instances of coupled vibrations to values of the first and second depth of cut controller design parameters;
based on the correlation, determine a set of one or more limits for the first and second depth of cut controller design parameters that mitigate occurrences of coupled vibrations;
generate drill bit design rules based, at least in part, on the one or more limits for the first and second depth of cut controller design parameters, wherein the drill bit design rules include generating a multi-parameter design space wherein coupled vibrations are mitigated; and
produce a drill bit with minimum of coupled vibration when used in a drilling run in a formation based on the drill bit design rules.

14. The apparatus of claim 13, further comprising instructions to:
validate a drill bit design based, at least in part, on the generated drill bit design rules, wherein validation comprises instructions to determine that a value for the first and second depth of cut controller design parameters for the drill bit design lies within the set of one or more limits for values of the first and second depth of cut controller design parameters that mitigate occurrences of coupled vibrations; and
based on a determination that the drill bit design is not valid, adjust the drill bit design based, at least in part, on a difference between the value of the first and second depth of cut controller design parameters and the set of one or more limits for values of the first and second depth of cut controller design parameters that mitigate occurrences of coupled vibrations.

15. The apparatus of claim 13, wherein coupled vibrations comprise high frequency vibrations detected at a substantially similar frequency across at least two of axial, lateral, and torsional axes.

* * * * *